(12) United States Patent
Guo et al.

(10) Patent No.: US 12,684,773 B2
(45) Date of Patent: Jul. 14, 2026

(54) THREE-DIMENSIONAL MEMORY DEVICES HAVING ISOLATION STRUCTURE FOR SOURCE SELECT GATE LINE AND METHODS FOR FORMING THE SAME

(71) Applicant: YANGTZE MEMORY TECHNOLOGIES CO., LTD., Wuhan (CN)

(72) Inventors: Zhen Guo, Wuhan (CN); Jingjing Geng, Wuhan (CN); Bin Yuan, Wuhan (CN); Jiajia Wu, Wuhan (CN); Xiangning Wang, Wuhan (CN); Zhu Yang, Wuhan (CN); Chen Zuo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 190 days.

(21) Appl. No.: 18/202,073

(22) Filed: May 25, 2023

(65) Prior Publication Data

US 2023/0301106 A1 Sep. 21, 2023

Related U.S. Application Data

(63) Continuation of application No. 17/084,378, filed on Oct. 29, 2020, now Pat. No. 11,711,921, which is a
(Continued)

(51) Int. Cl.
H10B 43/27 (2023.01)
H10W 10/00 (2026.01)
(Continued)

(52) U.S. Cl.
CPC ........ H10B 43/27 (2023.02); H10W 10/0143 (2026.01); H10W 10/17 (2026.01); H10W 46/00 (2026.01); *H10W 46/301* (2026.01)

(58) Field of Classification Search
CPC ................... H10B 41/20–27; H10B 43/20–27
See application file for complete search history.

(56) References Cited

U.S. PATENT DOCUMENTS

2016/0204117 A1 7/2016 Liu et al.
2017/0018569 A1 1/2017 Ohashi et al.
(Continued)

FOREIGN PATENT DOCUMENTS

CN 108630699 A 10/2018
CN 109300899 A 2/2019
(Continued)

OTHER PUBLICATIONS

Machine translation of CN 109390348 A.*
(Continued)

*Primary Examiner* — Bryan R Junge
(74) *Attorney, Agent, or Firm* — BAYES PLLC

(57) ABSTRACT

Embodiments of three-dimensional (3D) memory devices are disclosed. In an example, a 3D memory device includes a semiconductor layer, a memory stack over the semiconductor layer, first channel structures each extending vertically through the memory stack in an edge region, and an isolation structure. The memory stack includes a plurality of interleaved conductive layers and dielectric layers. At least one of conductive layers toward the semiconductor layer is a source select gate line (SSG). The isolation structure extends vertically through the SSG and into the semiconductor layer. The memory stack includes a core array region, a staircase region, and the edge region being laterally between the core array region and the staircase region. At least one of the first channel structures extends through the isolation structure and is separated from the SSG through the isolation structure.

20 Claims, 15 Drawing Sheets

Related U.S. Application Data continuation of application No. PCT/CN2020/113423, filed on Sep. 4, 2020.

(51) Int. Cl.
      *H10W 10/17*      (2026.01)
      *H10W 46/00*      (2026.01)

(56)                References Cited

U.S. PATENT DOCUMENTS

| | | | |
|---|---|---|---|
| 2017/0040337 A1 | | 2/2017 | Kim et al. |
| 2017/0077125 A1 | | 3/2017 | Yamasaki et al. |
| 2017/0125430 A1 | | 5/2017 | Nishikawa et al. |
| 2017/0229472 A1 | | 8/2017 | Lu et al. |
| 2017/0278571 A1 | | 9/2017 | Chowdhury et al. |
| 2018/0294225 A1* | | 10/2018 | Lee ........................ H10B 43/40 |
| 2018/0294276 A1 | | 10/2018 | Liu et al. |
| 2019/0035804 A1* | | 1/2019 | Kim ........................ H10B 43/35 |
| 2019/0081059 A1 | | 3/2019 | Xu et al. |
| 2019/0088493 A1 | | 3/2019 | Watanabe et al. |
| 2019/0326308 A1* | | 10/2019 | Pu .......................... H10D 30/63 |
| 2021/0013304 A1 | | 1/2021 | Ryu et al. |
| 2021/0225872 A1* | | 7/2021 | Sun ........................ H10B 43/50 |
| 2021/0305270 A1* | | 9/2021 | Jeong ..................... H10B 43/50 |

FOREIGN PATENT DOCUMENTS

| | | | | | |
|---|---|---|---|---|---|
| CN | 109390348 A | * | 2/2019 | .......... | H01L 27/1157 |
| CN | 109768048 A | | 5/2019 | | |
| CN | 109791932 A | | 5/2019 | | |
| CN | 110168724 A | | 8/2019 | | |
| CN | 110349967 A | | 10/2019 | | |
| CN | 110462828 A | | 11/2019 | | |
| CN | 110914989 A | | 3/2020 | | |
| CN | 111566816 A | | 4/2020 | | |
| CN | 111183520 A | | 5/2020 | | |
| CN | 111211130 A | * | 5/2020 | ............ | H10B 41/27 |
| CN | 111279465 A | | 6/2020 | | |
| CN | 112997309 A | | 6/2021 | | |
| TW | I689048 B | | 3/2020 | | |
| TW | I693630 B | | 5/2020 | | |
| TW | 202021088 A | | 6/2020 | | |
| TW | 202032765 A | | 9/2020 | | |

OTHER PUBLICATIONS

Machine translation of CN 111211130 A.*
International Search Report issued in corresponding International Application No. PCT/CN2020/113429, mailed May 26, 2021, 4 pages.
International Search Report issued in corresponding International Application No. PCT/CN2020/113423, mailed May 31, 2021, 4 pages.

* cited by examiner

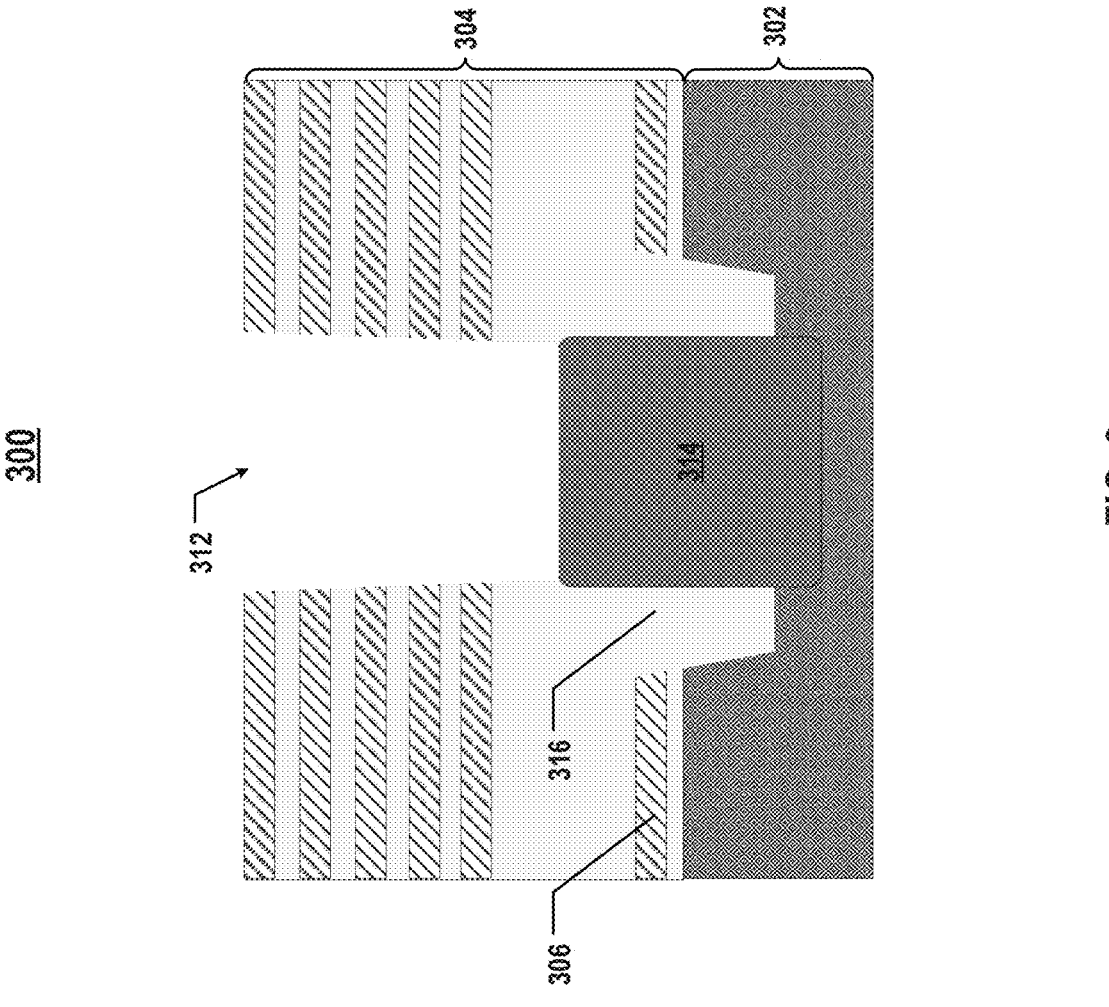
300
304
302
312
316
306
314
FIG. 3
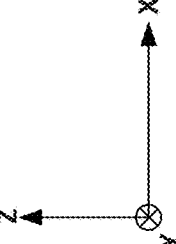

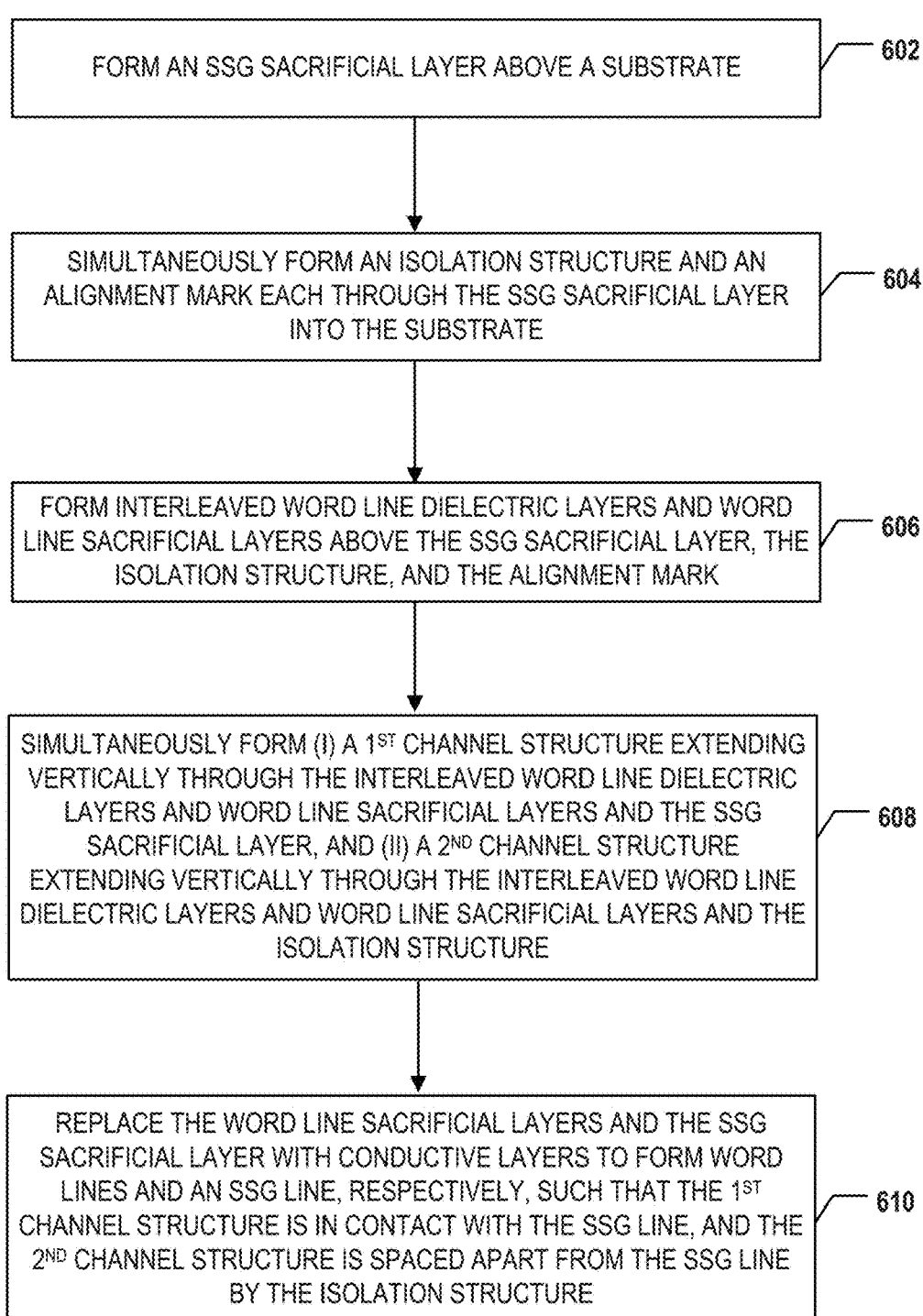

600

FORM AN SSG SACRIFICIAL LAYER ABOVE A SUBSTRATE — 602

SIMULTANEOUSLY FORM AN ISOLATION STRUCTURE AND AN ALIGNMENT MARK EACH THROUGH THE SSG SACRIFICIAL LAYER INTO THE SUBSTRATE — 604

FORM INTERLEAVED WORD LINE DIELECTRIC LAYERS AND WORD LINE SACRIFICIAL LAYERS ABOVE THE SSG SACRIFICIAL LAYER, THE ISOLATION STRUCTURE, AND THE ALIGNMENT MARK — 606

SIMULTANEOUSLY FORM (I) A 1ST CHANNEL STRUCTURE EXTENDING VERTICALLY THROUGH THE INTERLEAVED WORD LINE DIELECTRIC LAYERS AND WORD LINE SACRIFICIAL LAYERS AND THE SSG SACRIFICIAL LAYER, AND (II) A 2ND CHANNEL STRUCTURE EXTENDING VERTICALLY THROUGH THE INTERLEAVED WORD LINE DIELECTRIC LAYERS AND WORD LINE SACRIFICIAL LAYERS AND THE ISOLATION STRUCTURE — 608

REPLACE THE WORD LINE SACRIFICIAL LAYERS AND THE SSG SACRIFICIAL LAYER WITH CONDUCTIVE LAYERS TO FORM WORD LINES AND AN SSG LINE, RESPECTIVELY, SUCH THAT THE 1ST CHANNEL STRUCTURE IS IN CONTACT WITH THE SSG LINE, AND THE 2ND CHANNEL STRUCTURE IS SPACED APART FROM THE SSG LINE BY THE ISOLATION STRUCTURE — 610

FIG. 6

THREE-DIMENSIONAL MEMORY DEVICES HAVING ISOLATION STRUCTURE FOR SOURCE SELECT GATE LINE AND METHODS FOR FORMING THE SAME

CROSS-REFERENCE TO RELATED APPLICATIONS

This application is a continuation of U.S. application Ser. No. 17/084,378, filed on Oct. 29, 2020, entitled "THREE-DIMENSIONAL MEMORY DEVICES HAVING ISOLATION STRUCTURE FOR SOURCE SELECT GATE LINE AND METHODS FOR FORMING THEREOF," which is a continuation of International Application No. PCT/CN2020/113423, filed on Sep. 4, 2020, entitled "THREE-DIMENSIONAL MEMORY DEVICES HAVING ISOLATION STRUCTURE FOR SOURCE SELECT GATE LINE AND METHODS FOR FORMING THEREOF," both of which are hereby incorporated by reference in their entireties. This application is also related to U.S. application Ser. No. 17/084,346, filed on Oct. 29, 2020, entitled "THREE-DIMENSIONAL MEMORY DEVICES HAVING ISOLATION STRUCTURE FOR SOURCE SELECT GATE LINE AND METHODS FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a substrate, a memory stack on the substrate, a plurality of channel structures each extending vertically through the memory stack, an isolation structure, and an alignment mark. The memory stack includes a plurality of interleaved conductive layers and dielectric layers. An outmost one of the conductive layers toward the substrate is a source select gate line (SSG). The isolation structure extends vertically into the substrate and surrounds at least one of the channel structures in a plan view to separate the SSG and the at least one channel structure. The alignment mark extends vertically into the substrate and is coplanar with the isolation structure.

In another example, a 3D memory device includes a substrate, an SSG extending laterally, an isolation structure extending vertically through the SSG into the substrate, a first channel structure extending vertically through the SSG into the substrate, and a second channel structure extending vertically through the isolation structure into the substrate and spaced apart from the SSG by the isolation structure.

In still another example, a method for forming a 3D memory device is disclosed. An SSG sacrificial layer is formed above a substrate. An isolation structure and an alignment mark each through the SSG sacrificial layer are simultaneously formed. A plurality of interleaved word line dielectric layers and word line sacrificial layers are formed above the SSG sacrificial layer, the isolation structure, and the alignment mark. A first channel structure extending vertically through the interleaved word line dielectric layers and word line sacrificial layers and the isolation structure is formed. The word line sacrificial layers and the SSG sacrificial layer are replaced with a plurality of conductive layers to form a plurality of word lines and an SSG, respectively, such that the first channel structure is spaced apart from the SSG by the isolation structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 3 illustrates a side view of a cross-section of an intermediate structure in forming a 3D memory device having an isolation structure for SSG, according to some embodiments of the present disclosure.

FIGS. 5A-5J illustrate an exemplary fabrication process for forming a 3D memory device having an isolation structure for SSG, according to some embodiments of the present disclosure.

FIG. 6 is a flowchart of an exemplary method for forming a 3D memory device having an isolation structure for SSG, according to some embodiments.

Figure 1:
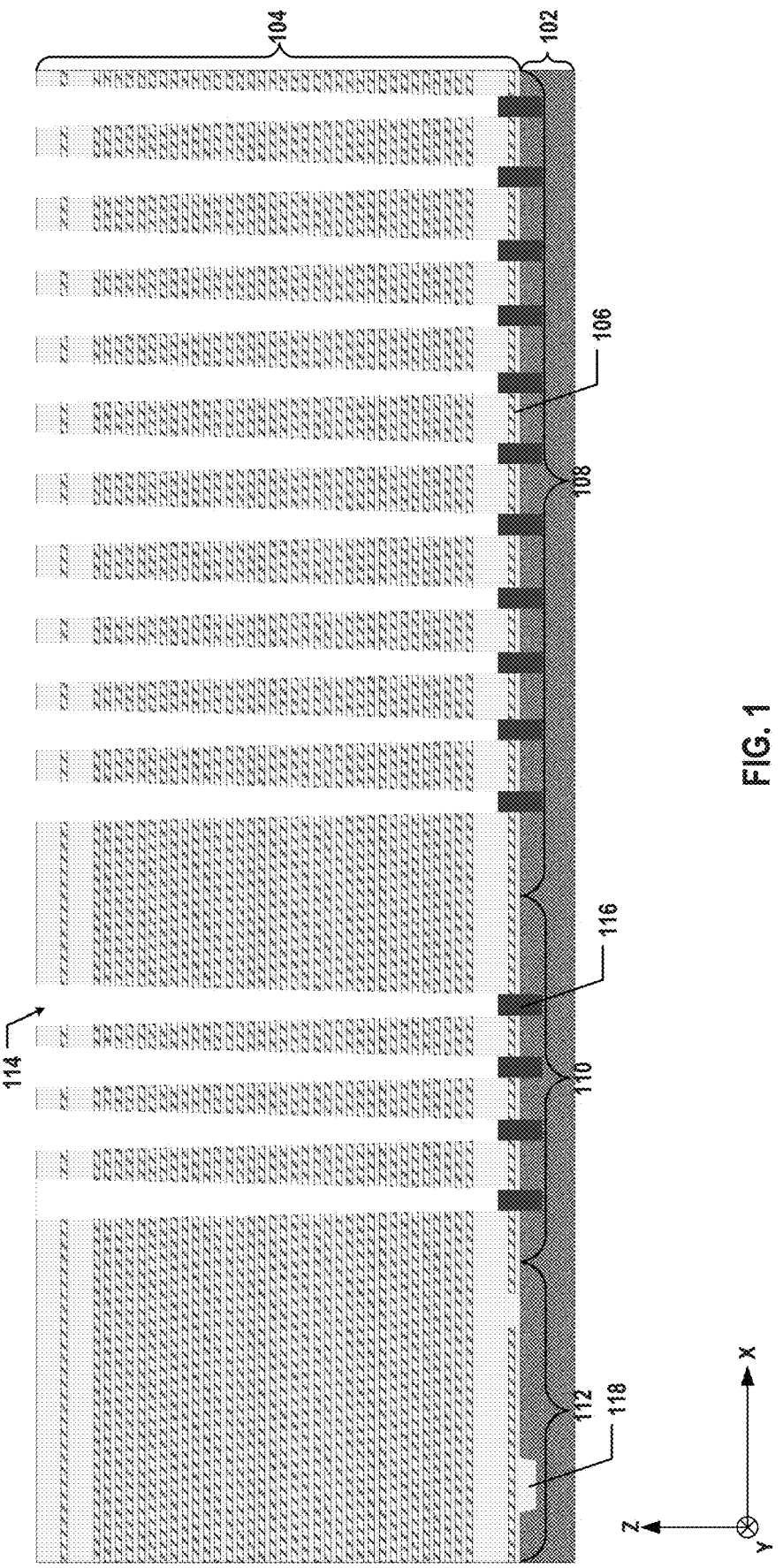
FIG. 1 illustrates a side view of a cross-section of an intermediate structure in forming a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, in forming channel structures, semiconductor plugs are first formed in the bottom of channel holes using selective epitaxial growth (thus also known as SEGs), for example, for channel hole gauging. However, for certain device designs, the quality or uniformity of SEGs in some channel holes may be unsatisfied; SEGs may even fail to form in some channel holes. As a result, the SSG and the substrate may be short-circuited to cause leakage current (SSG leakage) in the final 3D memory devices, thereby causing device failure.

In an example, during one stage of fabricating a 3D memory device having a core array region 108, an edge region 110, and a staircase region 112, a dielectric stack 104 is formed on a substrate 102 as shown in FIG. 1. Channel holes 114 are formed extending vertically through dielectric stack 104 into substrate 102 in core array regions 108 and edge region 110, but not in staircase region 112 in which the staircase structure is to be formed in the final 3D memory device. Semiconductor plugs 116 are selectively formed in the bottom portion of each channel hole 114 using epitaxial growth. However, as edge region 110 is laterally between core array region 108 that is full of channel holes 114 and staircase region 112 that is free of channel holes 114, the etch loading effect may cause unsatisfied etching of channel holes 114 in edge region 110 (e.g., with polymer residuals that are hard to be cleaned up), in particular, channel holes 114 in the one or more outmost columns adjacent to staircase region 112, which in turn jeopardizes the formation of semiconductor plugs 116 in those channel holes 114. As a result, during the gate-replacement process, when the bottom-most sacrificial layer 106 (also known as the SSG sacrificial layer) of dielectric stack 104 is replaced by a conductive layer (the SSG), the conductive material can leak into those channel holes 114 that do not have semiconductor plugs 116 or have defected semiconductor plugs 116 to short the SSG and substrate 102.

Figure 2A:
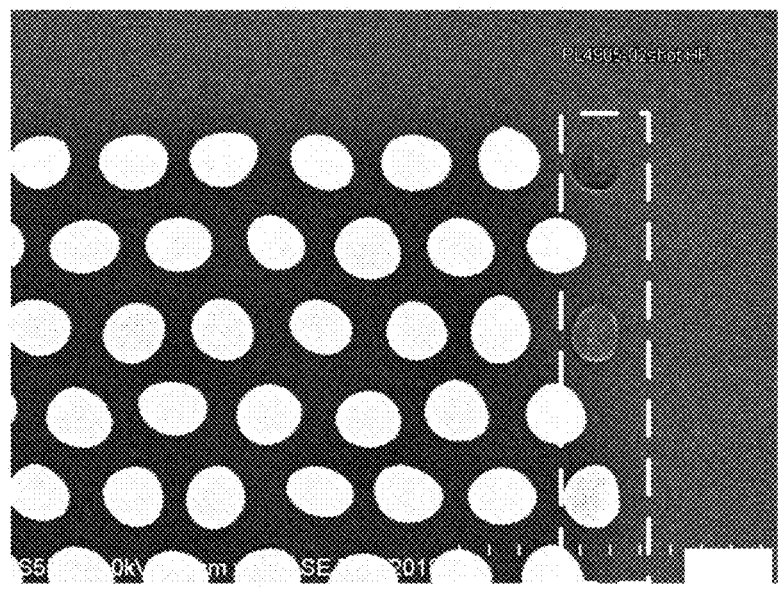
FIGS. 2A-2C illustrate plan view and side view images of cross-sections of an intermediate structure in forming a 3D memory device.
Figure 2B:
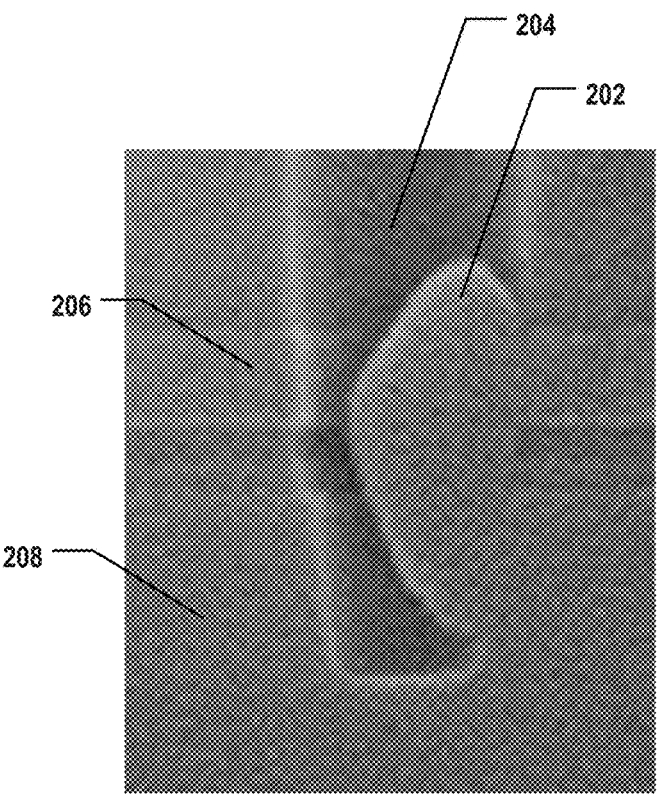

For example, in the image of FIG. 2A, semiconductor plugs (in the bright color) failed to form in some channel holes (in the dark color) in the outmost column (in the dashed box) of the core region. Short-circuit between the SSG and the substrate thus can occur in those channel holes in the final device. Even if semiconductor plugs can be formed, the quality or uniformity of the semiconductor plugs in those channel holes may be impaired as well. As shown in the image of FIG. 2B, although a semiconductor plug 202 is formed in the bottom portion of a channel hole 204, the quality of semiconductor plug 202 is unsatisfied as it leaves a void between SSG sacrificial layer 206 and substrate 208, which can cause short-circuit between the SSG and substrate 208 in the final device as well.

Figure 2C:
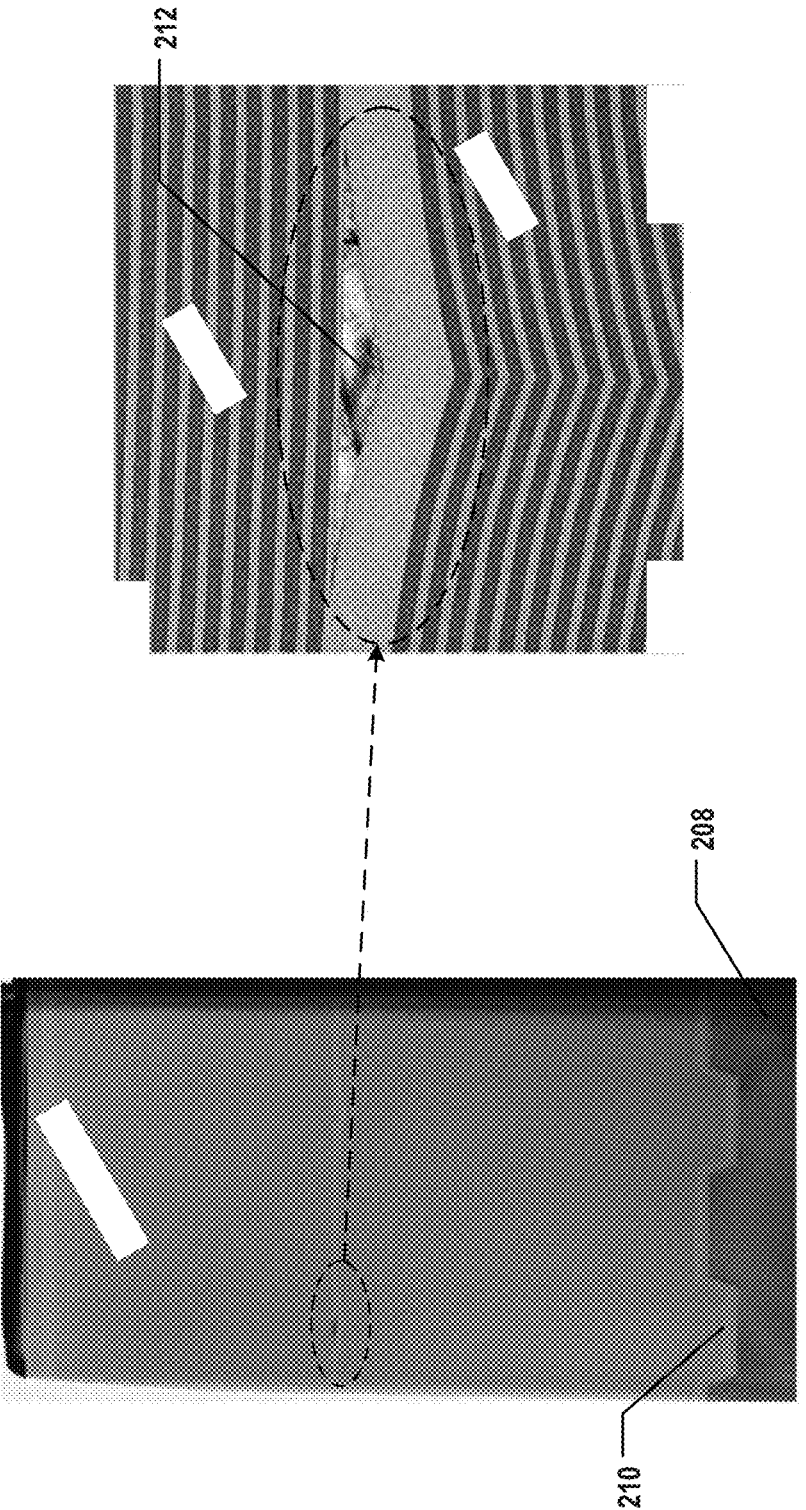

Moreover, one or more alignment marks 118 into substrate 102 are formed prior to the formation of dielectric stack 104, which can be used for alignment in later processes, such as when forming the staircase structure after the formation of the channel structures. However, as shown in the left-side image of FIG. 2C, the trench of an alignment mark 210 into substrate 208 may cause a dent (in the dashed oval) at the top surface of the stack structure (e.g., the lower dielectric deck of a dual-deck dielectric stack) right above alignment marks 210. As a result, in the right-side image of FIG. 2C residuals 212 (e.g., the polysilicon residual between the lower and upper dielectric decks of the dual-deck dielectric stack) may be trapped into the dent, which blocks the light to alignment mark 210 underneath for alignment in the later process, for example, in forming the staircase structure. Thus, the production yield can be reduced due to alignment failure.

Various embodiments in accordance with the present disclosure provide a 3D memory device having an isolation structure for SSG that can avoid SSG leakage. During the fabrication process, by separating the SSG sacrificial layer and the channel hole(s) using one or more isolation structures in the edge region that is prone to growth failure or defects of semiconductor plugs before the gate-replacement process, even the growth failure or voids in the semiconductor plugs would not turn into SSG leakage in the final 3D memory device.

FIG. 3 illustrates a side view of a cross-section of an intermediate structure 300 in forming a 3D memory device having an isolation structure for SSG, according to some embodiments of the present disclosure. As shown in FIG. 3, a dielectric stack 304 including an SSG sacrificial layer 306 (e.g., the bottom-most sacrificial layer) can be formed on a substrate 302. An array of channel holes 312 can be formed each extending vertically through dielectric stack 304 into substrate 302, and a semiconductor plug 314 can be selectively formed in the bottom portion of each channel hole 312. Different from the example shown in FIG. 1 in which each channel hole 114, including the one in edge region 110, extends through SSG sacrificial layer 306, such that SSG sacrificial layer 306 is in contact with channel holes 114 in edge region 110, channel hole 312 in the edge region as shown in FIG. 3 extends through an isolation structure 316 and thus, is spaced apart from SSG sacrificial layer 306 by isolation structure 316 therebetween. As a result, even if semiconductor plug 314 failed to form in channel hole 312 or had voids therein, SSG leakage would not occur due to the existence of isolation structure 316 laterally between the SSG (replacing SSG sacrificial layer 306) and substrate 302 exposed in channel hole 312. In some embodiments, isolation structure 316, like a shallow trench isolation (STI), extends through SSG sacrificial layer 306 into substrate 302, such that the bottom surface of isolation structure 316 is below the top surface of substrate 302.

Moreover, the formation of the isolation structures can be in the same process of forming the alignment mark and SSG cut, which does not introduce additional fabrication process and cost. As a result, the isolation structure, alignment mark, and SSG cut can be coplanar. In some embodiments, the top surfaces of the isolation structure, alignment mark, and SSG cut are planarized before the formation of the dielectric stack. The flat surface of the alignment mark thus can prevent the dent at the top surface of the dielectric stack, thereby avoiding the residuals in the dent that can cause alignment failure in later processes.

In some embodiments, the final 3D memory device after fabrication thus includes the isolation structure extending vertically into the substrate and surrounding at least one of the channel structures in the edge core to separate the SSG and the channel structure, as well as the alignment mark extending vertically into the substrate and coplanar with the isolation structure.

Figure 4A:
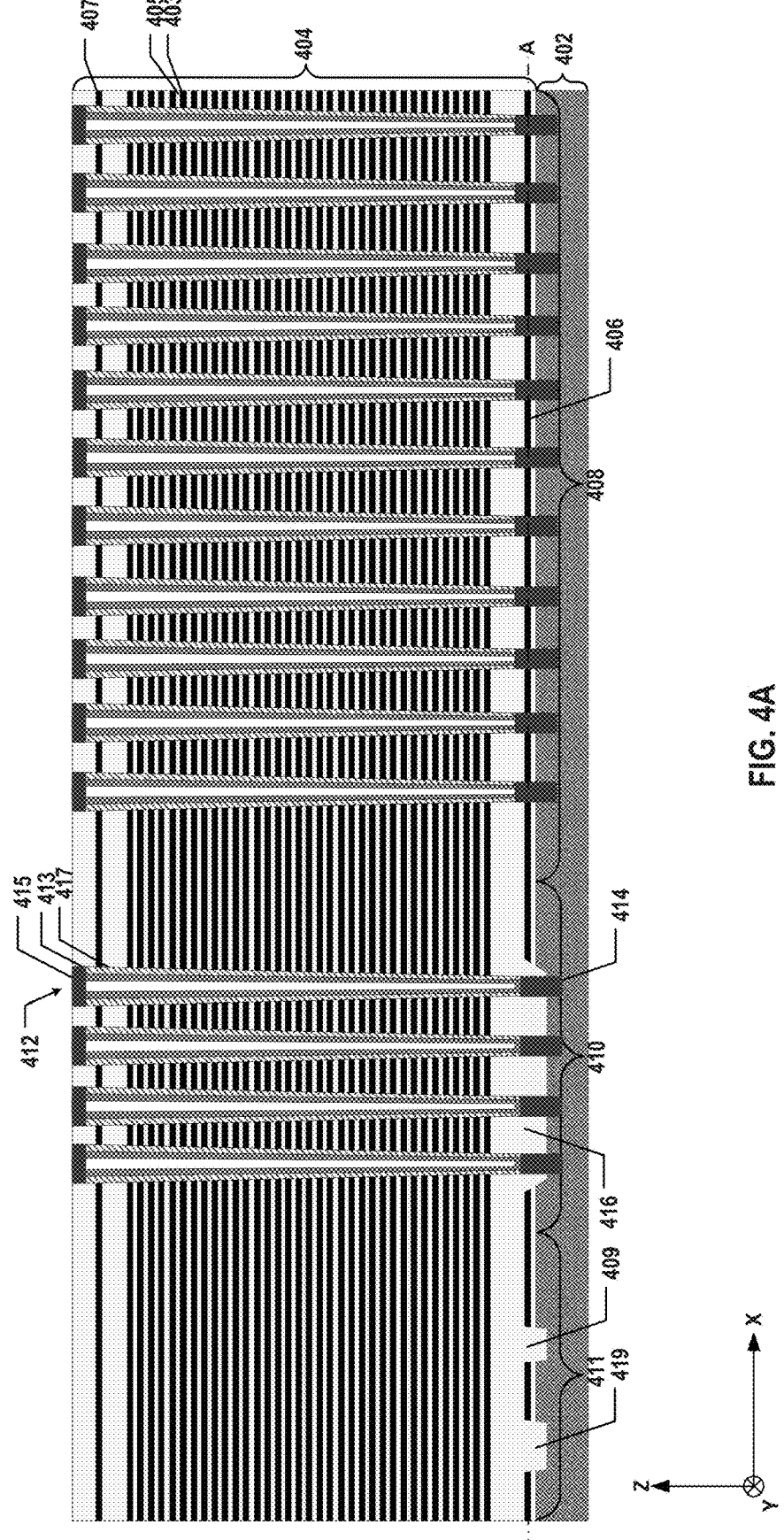
FIG. 4A illustrates a side view of a cross-section of an exemplary 3D memory device having an isolation structure for SSG, according to some embodiments of the present disclosure.
Figure 4B:
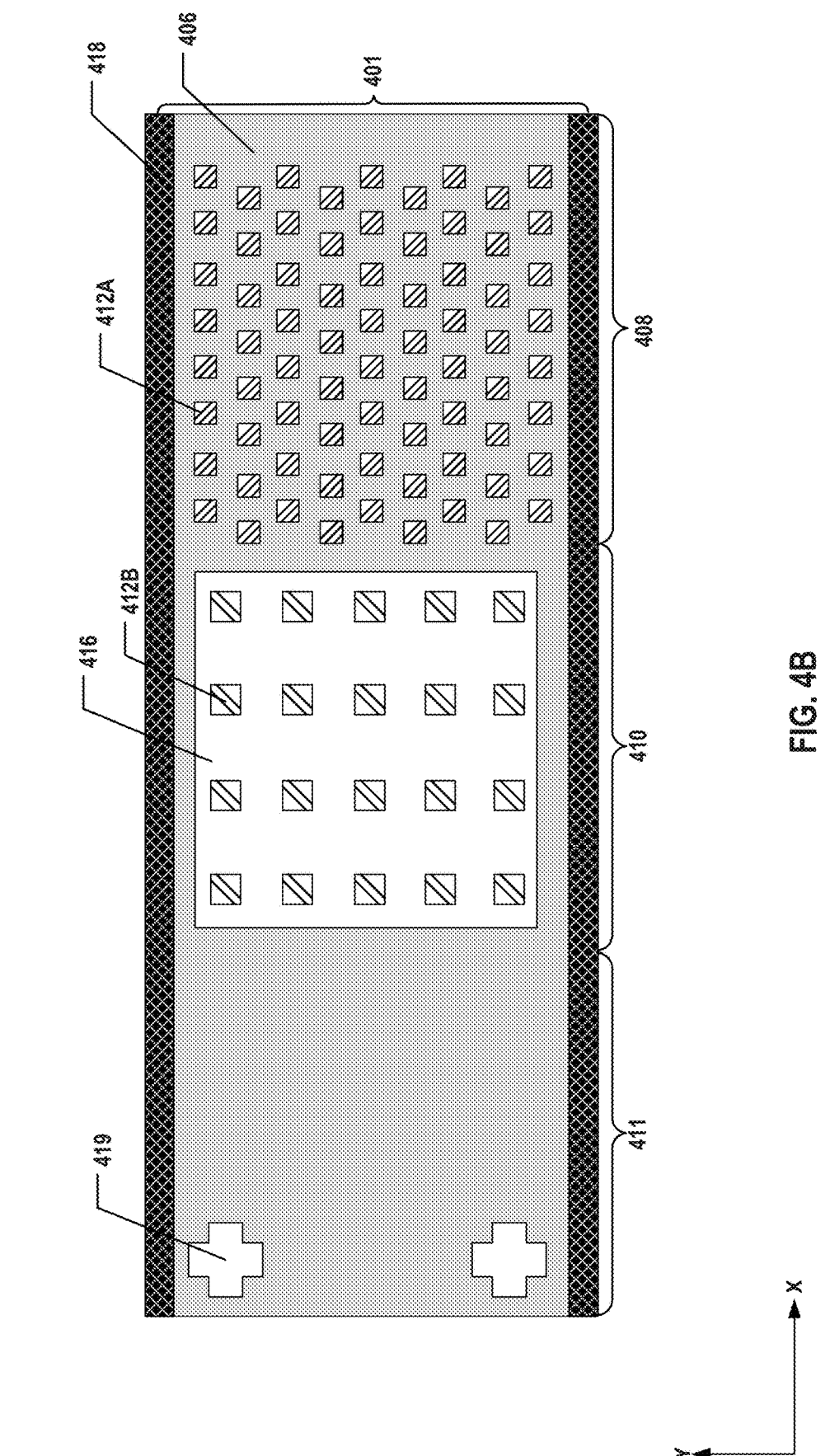
FIG. 4B illustrates a plan view of a cross-section of an exemplary 3D memory device having an isolation structure for SSG, according to some embodiments of the present disclosure.

FIG. 4A illustrates a side view of a cross-section of an exemplary 3D memory device 400 having an isolation structure for SSG, according to some embodiments of the present disclosure. 3D memory device 400 may be one example of the final 3D memory device of intermediate structure 300 in FIG. 3 after fabrication. FIG. 4B illustrates a plan view of a cross-section of 3D memory device 400 having an isolation structure for SSG, according to some embodiments of the present disclosure. FIG. 4B may illustrate an example of a plan view of the cross-section in the AA plane of 3D memory device 400 in FIG. 4A.

3D memory device 400 can include a substrate 402, which can include silicon (e.g., single crystalline silicon), silicon germanium (SiGe), gallium arsenide (GaAs), germanium (Ge), silicon on insulator (SOI), or any other suitable materials. In some embodiments, substrate 402 is a thinned substrate (e.g., a semiconductor layer), which was thinned from a normal thickness by grinding, wet/dry etching, chemical mechanical polishing (CMP), or any combination thereof. It is noted that x-, y-, and z-axes are included in FIG. 4A to illustrate the spatial relationships of the components in 3D memory device 400. Substrate 402 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 400) is determined relative to the substrate of the semiconductor device (e.g., substrate 402) in the z-direction (the vertical direction perpendicular to the x-y plane) when the substrate is positioned in the lowest plane of the semiconductor device in the z-direction. The same notion for describing spatial relationships is applied throughout the present disclosure.

3D memory device 400 can include a memory stack 404 on substrate 402. Memory stack 404 can be a stacked storage structure through which NAND memory strings (e.g., in the form of channel structures 412) are formed. In some embodiments, memory stack 404 includes a plurality of conductive/dielectric layer pairs stacked vertically on substrate 402. Each conductive/dielectric layer pair can include a conductive layer 403 and a dielectric layer 405. That is, memory stack 404 can include interleaved conductive layers 403 and dielectric layers 405 stacked vertically. The number of conductive/dielectric layer pairs in memory stack 404 (e.g., 32, 64, 96, 128, 144, 160, 176, 192, 256, etc.) can set the number of memory cells in 3D memory device 400. It is understood that in some embodiments, memory stack 404 may have a multi-deck architecture (not shown), which includes a plurality of memory decks stacked over one another. The numbers of the pairs of conductive layers 403 and dielectric layers 405 in each memory deck can be the same or different.

Conductive layers 403 can each have the same thickness or have different thicknesses. Similarly, dielectric layers 405 can each have the same thickness or have different thicknesses. Conductive layers 403 can include conductive materials including, but not limited to, tungsten (W), cobalt (Co), copper (Cu), aluminum (Al), polycrystalline silicon (polysilicon), doped silicon, silicides, or any combination thereof. Dielectric layers 405 can include dielectric materials including, but not limited to, silicon oxide, silicon nitride, silicon oxynitride, or any combination thereof. In some embodiments, conductive layers 403 include metals, such as W, and dielectric layers 405 include silicon oxide. It is understood that a silicon oxide film (not shown), such as an in-situ steam generation (ISSG) silicon oxide, is formed between substrate 402 (e.g., a silicon substrate) and memory stack 404, according to some embodiments.

In some embodiments, the outmost ones of conductive layers 403 of memory stack 404 function as the select gate lines to control the source and/or drain of each NAND memory string (e.g., in the form of channel structure 412). The outmost one of conductive layers 403 toward substrate 402 (i.e., the bottom-most conductive layer in FIG. 4A) can be an SSG 406 (also known as bottom select gate line (BSG)) for control the source of the NAND memory string, and the outmost one of conductive layers 403 away from substrate 402 (i.e., the top-most conductive layer in FIG. 4A) can be a drain select gate line 407 (DSG, also known as top select gate line (TSG)) for control the drain of the NAND memory string. It is understood that the number of conductive layers 403 functioning as the SSG 406 or DSG 407 is not limited to 1 and may be more than 1 in some examples. It is also understood that although SSG 406 and DSG 407 each is named as a "line," the shape is not limited to a one-dimensional line segment in the x-direction or y-direction and may extend laterally in a plane in two dimensions (e.g., SSG 406 in the x-y plane in FIG. 4B). The remaining conductive layers 403 of memory stack 404 (e.g., conductive layers 403 vertically between SSG 406 and DSG 407) are the gate lines/word lines for controlling the memory cells in the NAND memory string, according to some embodiments.

As shown in FIG. 4A, 3D memory device 400 can include a plurality of channel structures 412 each extending vertically through memory stack 404 into substrate 402. Channel structure 412 can include a channel hole filled with semiconductor materials (e.g., forming a semiconductor channel 413) and dielectric materials (e.g., forming a memory film 417). In some embodiments, semiconductor channel 413 includes silicon, such as amorphous silicon, polysilicon, or single crystalline silicon. In some embodiments, memory film 417 is a composite layer including a tunneling layer, a storage layer (also known as a "charge trap/storage layer"), and a blocking layer. The remaining space of channel structure 412 can be partially or fully filled with a capping layer including dielectric materials, such as silicon oxide, and/or an air gap. Channel structure 412 can have a cylinder shape (e.g., a pillar shape). The capping layer, semiconductor channel 413, the tunneling layer, storage layer, and blocking layer of memory film 417 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 417 can include a composite layer of silicon oxide/silicon oxynitride/silicon oxide (ONO).

In some embodiments, channel structure 412 includes two plugs 414 and 415 at a respective end in the vertical direction. As shown in FIG. 4A, channel structure 412 can include a semiconductor plug 414 at one end toward substrate 402 (i.e., the lower end). As used herein, the "upper end" of a component (e.g., channel structure 412) is the end farther away from substrate 402 in the z-direction, and the "lower end" of the component (e.g., channel structure 412) is the end closer to substrate 402 in the z-direction when substrate 402 is positioned in the lowest plane of 3D memory device 400. Semiconductor plug 414 can include a semiconductor material, such as single crystalline silicon, that is epitaxially grown from substrate 402. Semiconductor plug 414 can function as the controller of the source select gate of the NAND memory string together with SSG 406. Channel plug 415 can be at the upper end of channel structure 412 and can include semiconductor materials (e.g., polysilicon). By covering the upper end of channel structure 412 during the fabrication of 3D memory device 400, channel plug 415 can function as an etch stop layer to prevent etching of dielectrics filled in channel structure 412, such as silicon oxide and silicon nitride. In some embodiments, channel plug 415 functions as the drain of the NAND memory string.

As further shown in FIG. 4B, 3D memory device 400 can include core array region 408 and an edge region 410 in the plan view. In some embodiments, 3D memory device 400 further includes a staircase region 411, such that edge region 410 is laterally between staircase region 411 and core array region 408, for example, in the x-direction (the word line direction). That is, edge region 410 can be the transition region between core array region 408 and staircase region 411. Memory stack 404 can include a staircase structure (not shown) in staircase region 411 at which the word lines end for landing word line contacts (not shown). Each "level" of the staircase structure can include one or more conductor/dielectric layer pairs, each including conductive layer 403 and dielectric layer 405. In some embodiments, each two adjacent levels of the staircase structure are offset by a nominally same distance in the vertical direction and a nominally same distance in the lateral direction. For each two adjacent levels of the staircase structure, the first level that is closer to substrate 402 can extend laterally further than the second level, thereby forming a "landing area" on the first level for interconnection in the vertical direction. In some embodiments, channel structures 412 are disposed in core array region 408 and edge region 410, but not in staircase region 411. It is understood that dummy channel structures (not shown) may be formed in staircase region 411 in the final device of 3D memory device 400 in some examples. But similar to the example in FIG. 1, at a certain stage during the fabrication process, staircase region 411 may be free of any channel structure or dummy channel structures, as shown in FIG. 4B.

To mitigate the challenge caused by the etch loading effect and the resulting growth failure or defect issues of semiconductor plug 414 in edge region 410 as described above with respect to FIG. 1, in some embodiments, channel structures 412 have different lateral dimensions (e.g., diameters) in core array region 408 and edge region 410. As shown in FIG. 4B, the lateral dimension (e.g., the diameter or side length) of edge channel structures 412B (i.e., channel structures 412 disposed in edge region 410) is greater than the lateral dimension (e.g., the diameter or side length) of core channel structures 412A (i.e., channel structures 412 disposed in core array region 408), according to some embodiments. By increasing the size of the channel holes in edge region 410, the polymer residual after etching may be more easily removed by cleaning prior to the formation of semiconductor plugs 414, thereby increasing the growth quality of semiconductor plugs 414. It is understood that the dimensions of edge channel structures 412B and core channel structures 412A may be the same in some examples. Regardless, in some embodiments, the structures of edge channel structures 412B and core channel structures 412A are the same, as described above with respect to channel structure 412. In some embodiments, edge channel structures 412B are not used as NAND memory strings for storage, although they are similarly electrically connected to other components, like core channel structures 412A, which are used as NAND memory strings for storage.

Different from the example in FIG. 1, 3D memory device 400 can include an isolation structure 416 for SSG 406 in edge region 410 to avoid SSG leakage due to the growth failure or defects of semiconductor plugs 414 in edge channel structures 412B. As shown in FIG. 4B, isolation structure 416 surrounds edge channel structures 412B in the plan view to separate SSG 406 and edge channel structures 412B in edge region 410. Isolation structure 416, however, does not extend to core array region 408 or staircase region 411, according to some embodiments. Isolation structure 416 can include a dielectric including, but not limited to, silicon oxide, silicon nitride, silicon oxynitride, or any combination thereof. In some embodiments, isolation structure 416 includes the same dielectric material as dielectric layers 405 of memory stack 404, such as silicon oxide. As shown in FIG. 4B, SSG 406 can extend laterally across core array region 408 and edge region 410, and core channel structure 412A in core array region 408 can be in contact with SSG 406. In contrast, with isolation structure 416 in edge region 410, edge channel structure 412B in edge region 410 is spaced apart from SSG 406 by isolation structure 416, according to some embodiments. It is understood that although isolation structure 416 in FIG. 4B surrounds all edge channel structures 412B in edge region 410, it is understood that isolation structure 416 in other examples may surround one or some of edge channel structures 412B, such that the remaining edge channel structures 412B may be still in contact with SSG 406. In some embodiments, as the etch loading effect affects the channel holes in the outmost column adjacent to staircase region 411 in the plan view the most and gradually decreases in other columns toward core array region 408, isolation structure 416 surrounds edge channel structures 412B in the outmost column adjacent to staircase region 411, but not in other columns. It is understood that the number of the outmost column surrounded by isolation structure 416 is not limited to 1 and may be any number smaller than the total number of columns in edge region 410 in some examples.

As shown in the side view of FIG. 4A, isolation structure 416 extends vertically through SSG 406 in edge region 410 into substrate 402, such that at least one channel structure 412 in edge region 410 is contact with isolation structure 416, but not SSG 406. In some embodiments, isolation structure 416 is an STI, such that the bottom surface of isolation structure 416 is below the tops surface of substrate 402. Each channel structure 412 in core array region 408 extends vertically through DSG 407, the gate lines/word lines of conductive layers 403, and SSG 406, whereas at least one channel structure 412 in edge region 410 extends vertically through DSG 407, the gate lines/word lines of conductive layers 403, and isolation structure 416, instead of SSG 406, according to some embodiments. Because isolation structure 416 extends further into substrate 402, channel structure 412 surrounded by isolation structure 416 in edge region 410 extends into substrate further than channel structure 412 not surrounded by isolation structure 416, such as channel structures 412 in core array region 408, according to some embodiments. That is, in some embodiments, the lower end (semiconductor plug 414) of channel structure 412 surrounded by isolation structure 416 in edge region 410 is below the lower end (semiconductor plug 414) of channel structure 412 not surrounded by isolation structure 416, such as channels structures 412 in core array region 408.

In some embodiments, the upper end of semiconductor plugs 414 of each channel structure 412 is above SSG 406, such that semiconductor plug 414 of channel structure 412 in core array region 408 is in contact with SSG 406, and semiconductor plug 414 of at least one channel structure 412 in edge region 410 is in contact with isolation structure 416. The lateral distance between SSG 406 and at least one channel structure 412 (e.g., outmost edge channel structures 412B in FIG. 4B) in edge region 410, for example, the smallest distance between SSG 406 and semiconductor plug 414 surrounded by isolation structure 416, is between about 40 nm and about 80 nm, such as between 40 nm and 80 nm (e.g., 40 nm, 45 nm, 50 nm, 55 nm, 60 nm, 65 nm, 70 nm, 75 nm, 80 nm, any range bounded by the lower end by any of these values, or in any range defined by any two of these values). That is, channel structures 412 surrounded by isolation structure 416 in edge region 410 is spaced apart from SSG 406 by at least 40 nm to 80 nm to avoid SSG leakage, according to some embodiments.

In some embodiments, 3D memory device 400 further includes structures that can divide memory stack 404 and channel structures 412 into different areas to be individually controlled by various memory operations, such as read, write, program, or erase. As shown in FIG. 4B, 3D memory device 400 can include a plurality of parallel slit structures 418 (e.g., gate line slits (GLSs)) arranged in the y-direction and each extending in the x-direction to divide memory stack 404 and channel structures 412 into multiple memory blocks 401 arranged in the y-direction. Although not shown in FIG. 4B, within each memory block 401, additional structures, such as DSG cuts or SSG cuts, may further divide memory block 401 into multiple memory fingers. For example, as shown in the side view of FIG. 4A, 3D memory device 400 can further include SSG cuts 409 extending vertically through SSG 406 into substrate 402 to cut off SSG 406. As described below with respect to the fabrication process, as SSG cut 409 and isolation structure 416 can be formed in the same process, SSG cut 409 is coplanar with isolation structure 416, according to some embodiments. It is understood that although SSG cut 409 is disposed in staircase region 411 in FIG. 4A, SSG cut 409 may be disposed in other regions, such as core array region 408 and/or edge region 410, as well. For example, SSG cut 409 may extend laterally across core array region 408, edge region 410, and staircase region 411 to divide SSG 406 into different parts in memory block 401.

In some embodiments, 3D memory device 400 further includes one or more alignment marks 419 each extending vertically through SSG 406 into substrate 402. As described below with respect to the fabrication process, since alignment mark 419, SSG cut 409, and isolation structure 416 can be formed in the same process, alignment mark 419 is coplanar with SSG cut 409 and isolation structure 416, according to some embodiments. It is understood that alignment marks 419 may be used for alignment during the fabrication of 3D memory device 400, such as the formation of the staircase structure in staircase region 411 after the formation of channel structures 412, and may remain in the final product of 3D memory device 400 despite being unfunctional. It is understood that although alignment mark 419 is disposed in staircase region 411 in FIGS. 4A and 4B, alignment mark 419 may be disposed in other regions, such as core array region 408 and/or edge region 410, as well.

It is understood that 3D memory device 400 can include additional components and structures not shown in FIGS. 4A and 4B including, but not limited to, local contacts and interconnects in one or more middle-end-of-line (MEOL) and back-end-of-line (BEOL) interconnect layers, and peripheral circuits.

It is understood that the layout design of the isolation structure is not limited by the example of isolation structure 416 in FIGS. 4A and 4B and may include any other suitable layout designs, such as square, rectangle, circle, cross-shaped, donut-shaped, ring-shaped, etc. It is also understood that the number of the isolation structure is not limited by the example of single isolation structure 416 in FIGS. 4A and 4B and may be multiple isolation structures. For example, each of one or more of the channel structures in the edge region may be surrounded by an individual isolation structure, as opposed to sharing one isolation structure.

FIGS. 5A-5J illustrate an exemplary fabrication process for forming a 3D memory device having an isolation structure for SSG, according to some embodiments of the present disclosure. FIG. 6 is a flowchart of an exemplary method for forming a 3D memory device having an isolation structure for SSG, according to some embodiments. Examples of the 3D memory device depicted in FIGS. 5A-5J and 6 include 3D memory device 400 depicted in FIGS. 4A and 4B. FIGS. 5A-5J and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

In some embodiments, a dielectric stack including a plurality of interleaved dielectric layers and sacrificial layers is formed on a substrate. The bottom-most one of the sacrificial layers is penetrated through by an isolation structure, according to some embodiments. As shown in FIG. 3, dielectric stack 304 is formed on substrate 302, and SSG sacrificial layer 306, the bottom-most sacrificial layers, is penetrated through by isolation structure 316. The formation of the dielectric stack can include the formation of the isolation structure through the SSG sacrificial layer into the substrate, and the formation of interleaved word line dielectric layers and word line sacrificial layers above the SSG sacrificial layer and the isolation structure, as described below in detail.

Figure 7:
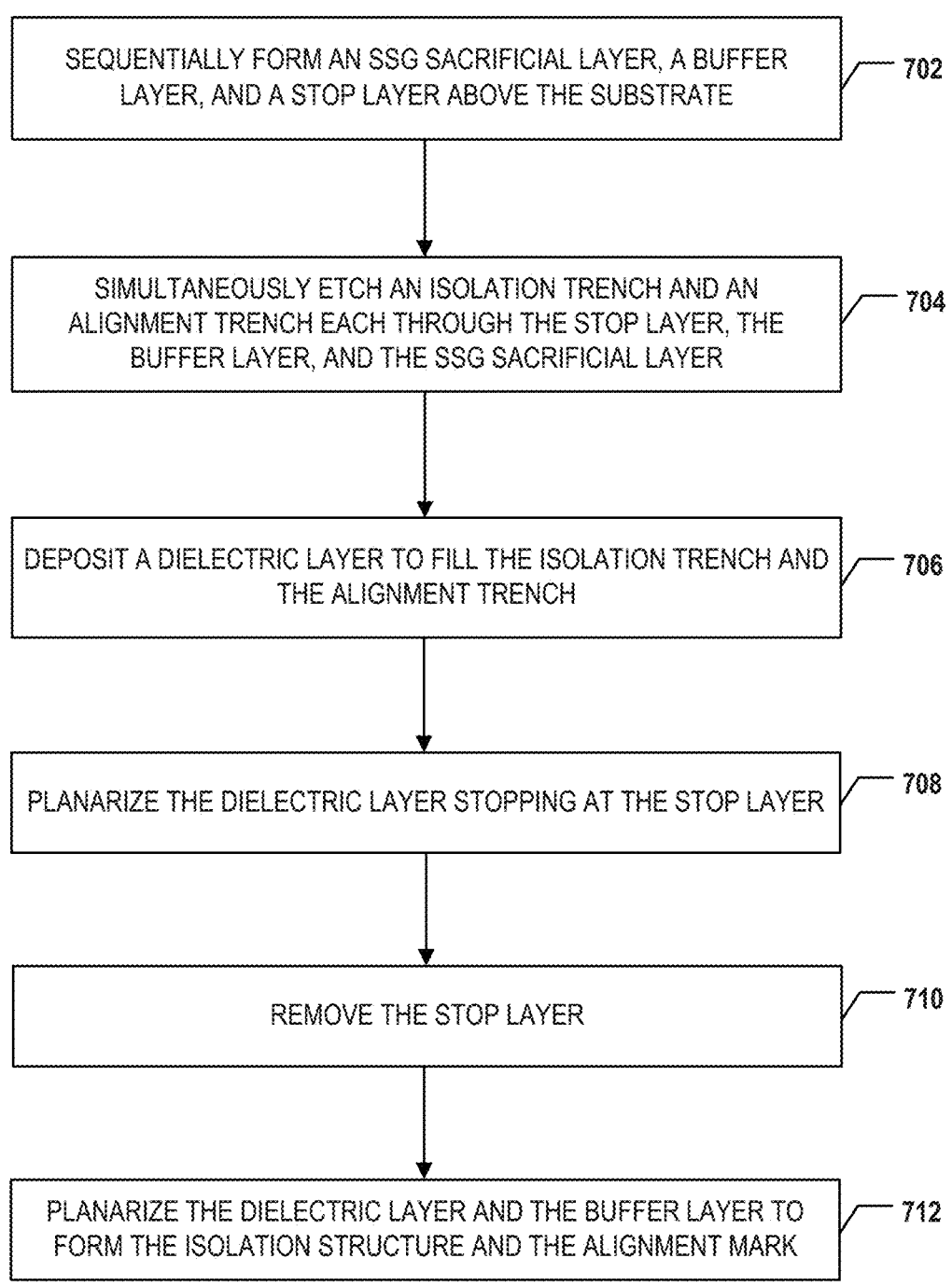
FIG. 7 is a flowchart of an exemplary method for forming an isolation structure for SSG in a 3D memory device, according to some embodiments of the present disclosure.

Referring to FIG. 6, method 600 starts at operation 602, in which an SSG sacrificial layer is formed above a substrate. Method 600 proceeds to operation 604, as illustrated in FIG. 6, in which an isolation structure and an alignment mark each through the SSG sacrificial layer are simultaneously formed. In some embodiments, an SSG cut through the SSG sacrificial layer is formed in the same process of forming the isolation structure and the alignment mark. FIG. 7 is a flowchart of an exemplary method for forming an isolation structure for SSG in a 3D memory device, according to some embodiments of the present disclosure. To simultaneously form the isolation structure and the alignment mark each through the SSG sacrificial layer, at operation 702, the SSG sacrificial layer, a buffer layer, and a stop layer are sequentially formed above the substrate. In some embodiments, an SSG dielectric layer is formed on the substrate prior to the formation of the SSG sacrificial layer. In some embodiments, a cap layer is formed on the stop layer after the formation of the stop layer. In some embodiments, the SSG sacrificial layer and stop layer include silicon nitride, and the SSG dielectric layer, buffer layer, and cap layer include silicon oxide. The substrate can be a silicon substrate.

Figures 5A, 5B:
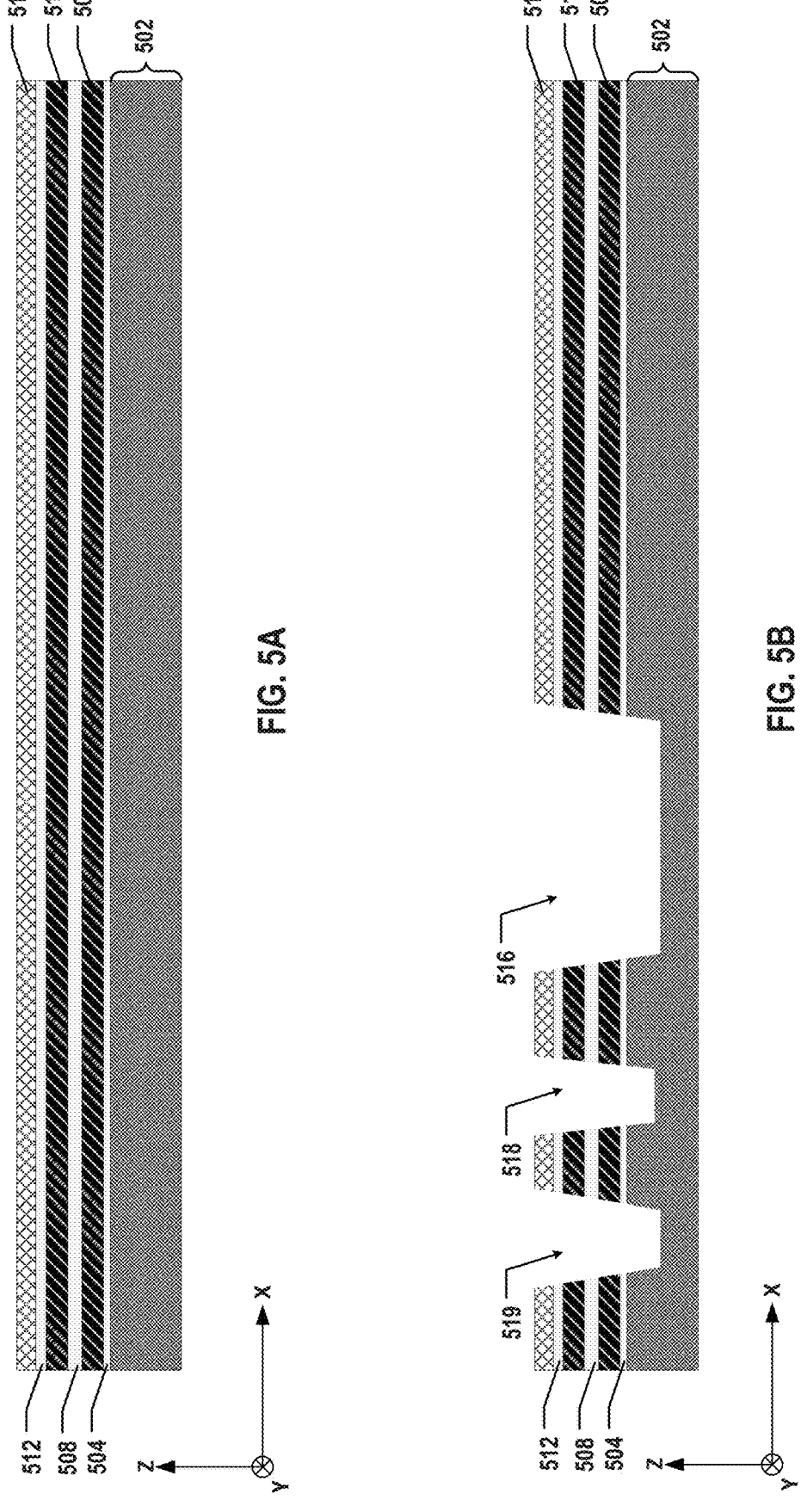

As illustrated in FIG. 5A, an SSG dielectric layer 504, an SSG sacrificial layer 506, a buffer layer 508, a stop layer 510, a cap layer 512, and a hard mask 514 are sequentially formed on a silicon substrate 502. In some embodiments, layers of silicon oxide and silicon nitride are alternatingly deposited on silicon substrate 502 using one or more thin film deposition processes including, but not limited to, physical vapor deposition (PVD), chemical vapor deposition (CVD), atomic layer deposition (ALD), or any combination thereof, such that SSG sacrificial layer 506 and stop layer 510 include silicon nitride, and SSG dielectric layer 504, buffer layer 508, and cap layer 512 include silicon oxide. In some embodiments, hard mask 514 includes one or more layers, such as spin-on-carbon (SOC) and silicon oxynitride, as a planarization layer and an anti-reflection layer, which can be formed using spin coating or any other thin film deposition processes including, but not limited to, PVD, CVD, ALD, or any combination thereof. Hard mask 514 can be used as the etch mask in the later process as well.

Referring back to FIG. 7, at operation 704, an isolation trench and an alignment trench each through the stop layer, the buffer layer, and the SSG sacrificial layer into the substrate are simultaneously etched. In some embodiments, an SSG cut trench is etched through the stop layer, the buffer layer, and the SSG sacrificial layer into the substrate as well in the same process. As illustrated in FIG. 5B, an isolation trench 516, an SSG cut trench 518, and an alignment trench 519 are etched through cap layer 512, stop layer 510, buffer layer 508, SSG sacrificial layer 506, and SSG dielectric layer 504 into silicon substrate 502. It is understood that isolation trench 516 may be patterned to any suitable isolation structure layout designs, such as the examples disclosed herein, using lithography. Hard mask 514 can be patterned according to the layout design of isolation trench 516, SSG cut trench 518, and alignment trench 519. In some embodiments, the exposed parts of cap layer 512, stop layer 510, buffer layer 508, SSG sacrificial layer 506, and SSG dielectric layer 504 underneath patterned hard mask 514 are then etched using dry etching and/or wet etching process, such as reactive ion etch (RIE) until reaching silicon substrate 502. To form an alignment mark, the top portions of silicon substrate 502 are etched as well, such that alignment trench 519, SSG cut trench 518, and isolation trench 516 extend further into silicon substrate 502, according to some embodiments. As formed using the same process, alignment trench 519, SSG cut trench 518, and isolation trench 516 can be coplanar with one another.

Figures 5C, 5D:
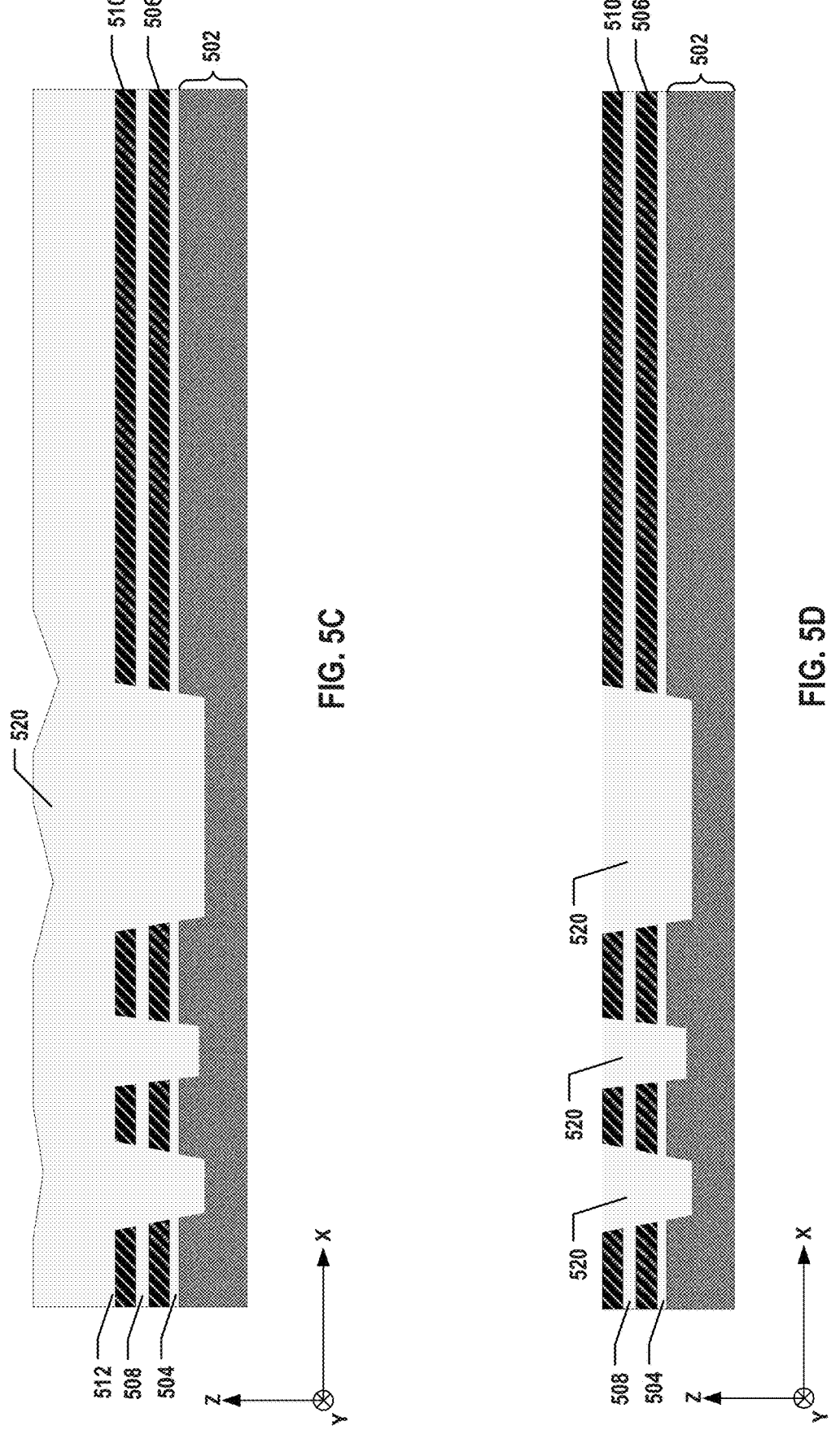

Referring back to FIG. 7, at operation 706, a dielectric layer is deposited to fill the isolation trench and the alignment trench. In some embodiments, the SSG cut trench is filled with the dielectric layer as well in the same process. As illustrated in FIG. 5C, a dielectric layer 520, such as a silicon oxide layer, the same material as SSG dielectric layer 504, buffer layer 508, and cap layer 512, is deposited to fill isolation trench 516, SSG cut trench 518, and alignment trench 519 (shown in FIG. 5B) using one or more thin film deposition processes including, but not limited to, PVD, CVD, ALD, or any combination thereof. The thickness of dielectric layer 520 is large enough to ensure that isolation trench 516, SSG cut trench 518, and alignment trench 519 are fully filled, according to some embodiments.

Referring back to FIG. 7, at operation 708, the dielectric layer is planarized, stopping at the stop layer. As illustrated in FIG. 5D, dielectric layer 520 is planarized until stop layer 510 using wet etching and/or CMP. In some embodiments, since both dielectric layer 520 and cap layer 512 have the same material, such as silicon oxide, which is different from stop layer 510, such as silicon nitride, stop layer 510 acts as the CMP stop layer and/or etch stop layer to control the stop of the planarization process to avoid damaging SSG sacrificial layer 506 underneath.

Figures 5E, 5F:
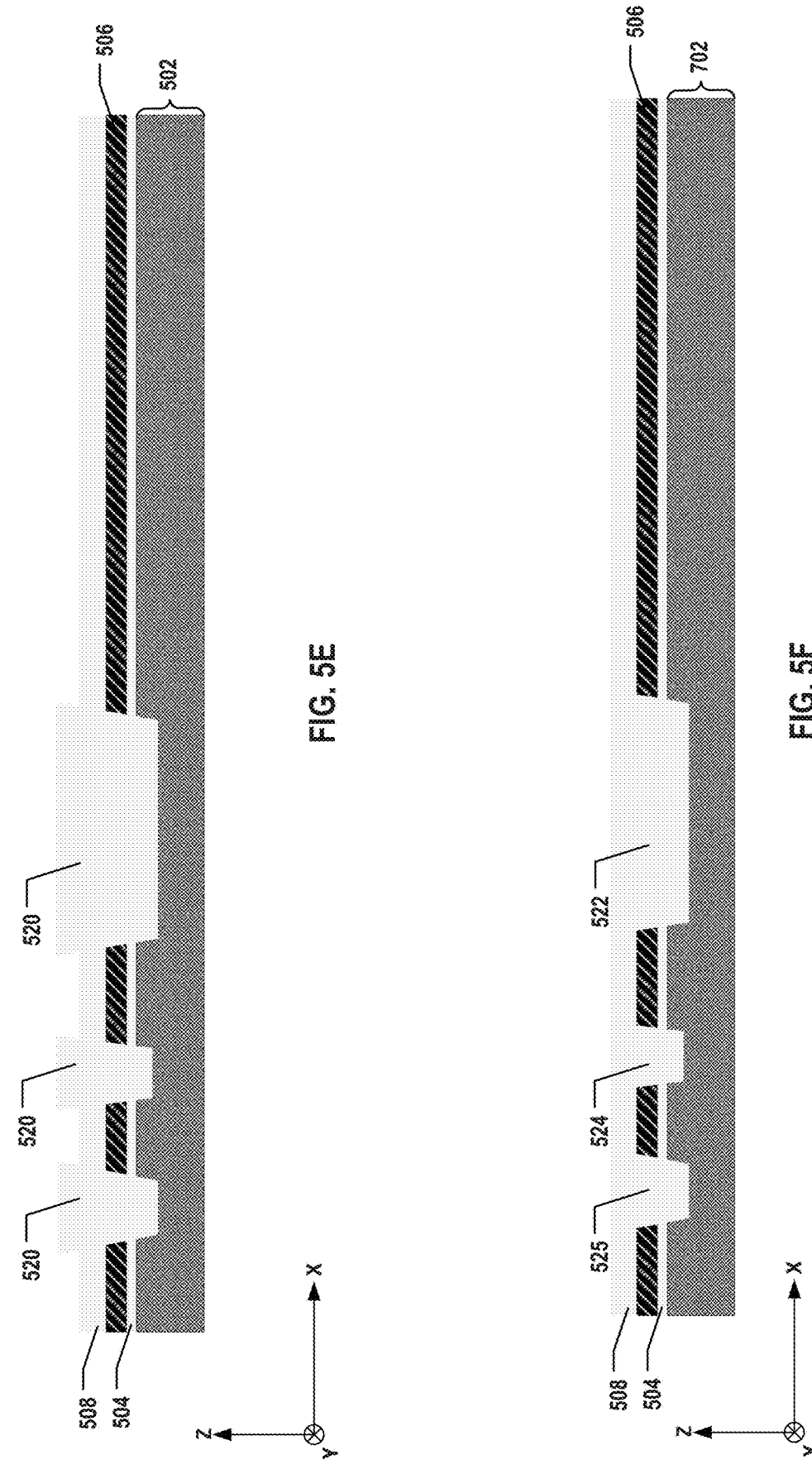

Referring back to FIG. 7, at operation 710, the stop layer is removed. As illustrated in FIG. 5E, stop layer 510 (shown in FIG. 5D) is removed using wet etching. In some embodiments in which stop layer 510 includes silicon nitride and dielectric layer 520 and buffer layer 508 include silicon oxide, phosphoric acid is used as the etchant to selectively etch stop layer 510, leaving dielectric layer 520 and buffer layer 508 intact.

Referring back to FIG. 7, at operation 712, the dielectric layer and the buffer layer are planarized to form the isolation structure and the alignment mark. In some embodiments, the SSG cut is formed as well in the same process. As illustrated in FIG. 5F, another planarization process is applied to planarize dielectric layer 520 (shown in FIG. 5E) and buffer layer 508 using wet etching and/or CMP to form an isolation structure 522, an SSG cut 524, and an alignment mark 525 each through SSG sacrificial layer 506 into silicon substrate 502. In some embodiments, SSG sacrificial layer 506 is cut off by SSG cut 524. It is understood that buffer layer 508 may be completely removed by the planarization process or partially left on SSG sacrificial layer 506 in different examples. As a result, isolation structure 522, SSG cut 524, and alignment mark 525 can be coplanar with one another. The planarization process can also ensure a flat surface of isolation structure 522, SSG cut 524, and alignment mark 525 to avoid any dent in the upper structure in later processes caused by, for example, alignment trench 519.

Method 600 proceeds to operation 606, as illustrated in FIG. 6 in which a plurality of interleaved word line dielectric layers and word line sacrificial layers are formed above the SSG sacrificial layer, the isolation structure, and the alignment mark. A dielectric stack including interleaved word line dielectric layers and word line sacrificial layers as well as the SSG sacrificial layer can be thereby formed above the substrate.

Figure 5G:
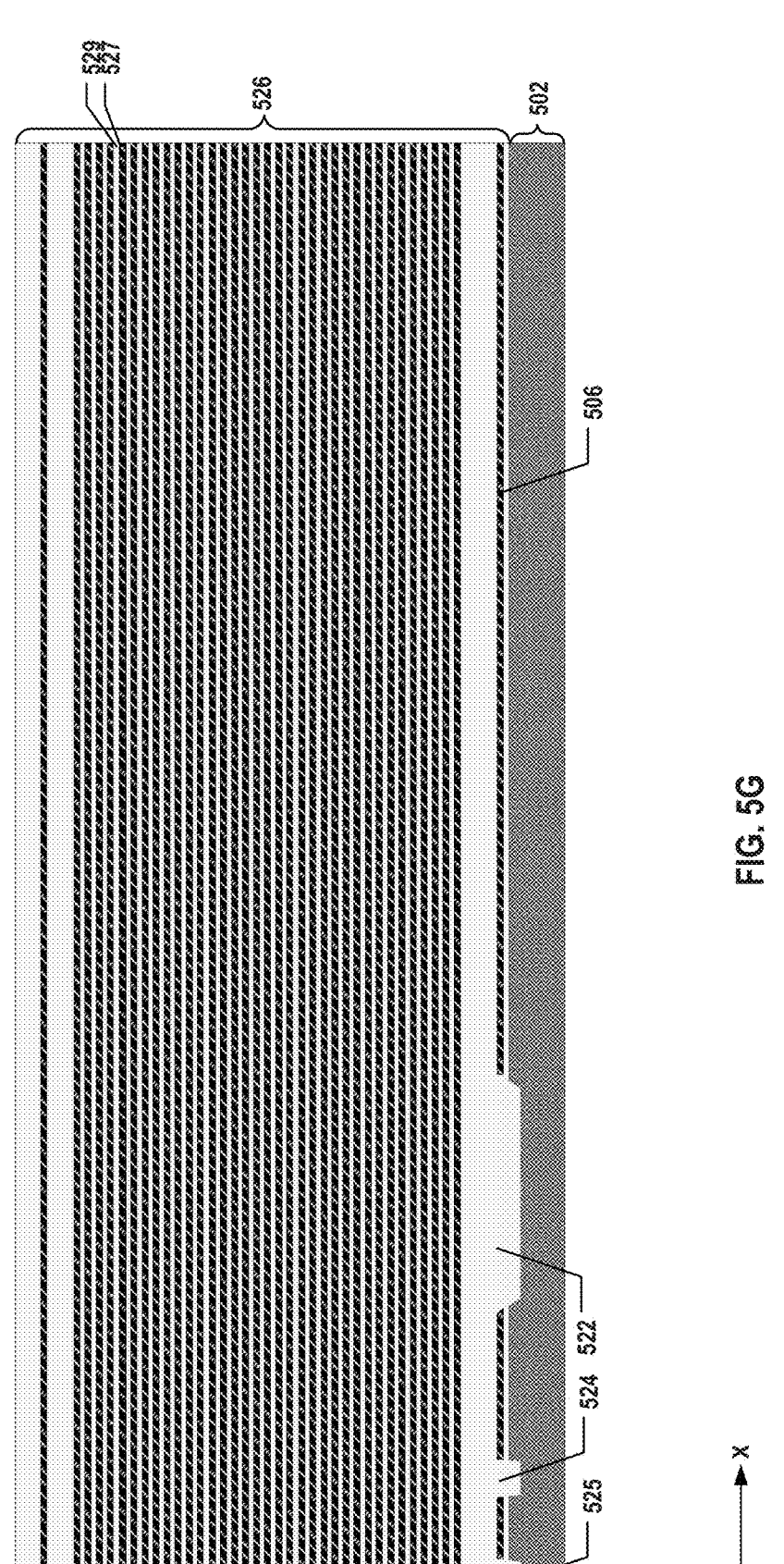

As illustrated in FIG. 5G, a dielectric stack 526 including a plurality of dielectric/sacrificial layer pairs is formed on silicon substrate 502. In some embodiments, word line sacrificial layers 527 and word line dielectric layers 529 are alternatingly deposited above SSG sacrificial layer 506, isolation structure 522, and alignment mark 525 (and SSG cut 524 in some examples) using one or more thin film deposition processes including, but not limited to, PVD, CVD, ALD, or any combination thereof. In some embodiments, word line sacrificial layers 527 include silicon nitride (the same material as SSG sacrificial layer 506), and word line dielectric layers 529 include silicon oxide. It is understood that the sequence of depositing word line sacrificial layers 527 and word line dielectric layers 529 is not limited. The deposition can start with word line sacrificial layers 527 or word line dielectric layers 529, for example, depending on whether SSG sacrificial layer 506 is covered with buffer layer 508 (shown in FIG. 5F). As a result, dielectric stack 526 including interleaved word line dielectric layers 529 and word line sacrificial layers 527 as well as SSG sacrificial layer 506 is thereby formed above silicon substrate 502, according to some embodiments. The bottom-most one of the sacrificial layers of dielectric stack 526, i.e., SSG sacrificial layer 506, is penetrated through by isolation structure 522 and alignment mark 525 and is cut off by SSG cut 524, according to some embodiments. Due to the flat surface of alignment mark 525, dents and residuals trapped therein right above alignment mark 525 can be avoided on the top surface of dielectric stack 526.

In some embodiments, after the formation of the dielectric stack, a plurality of channel structures each extending vertically through the dielectric stack into the substrate are formed, such that at least one of the channel structures extends through the isolation structure. The formation of the channel structures can include the formations of channel holes and semiconductor plugs, as described below in detail.

Method 600 proceeds to operation 608, as illustrated in FIG. 6, in which (i) a first channel structure extending vertically through the interleaved word line dielectric layers and word line sacrificial layers and the SSG sacrificial layer, and (ii) a second channel structure extending vertically through the interleaved word line dielectric layers and word line sacrificial layers and the isolation structure, are simultaneously formed. The lateral dimension of the second channel structure can be greater than the lateral dimension of the first channel structure. In some embodiments, to simultaneously form the first and second channel structures, (i) a first channel hole extending vertically through the interleaved word line dielectric layers and word line sacrificial layers and the SSG sacrificial layer into the substrate, and (ii) a second channel hole extending vertically through the interleaved word line dielectric layers and word line sacrificial layers and the isolation structure into the substrate, are simultaneously formed, and (i) a first semiconductor plug in a bottom portion of the first channel hole in contact with the SSG sacrificial layer, and (ii) a second semiconductor plug in a bottom portion of the second channel hole spaced apart from the SSG sacrificial layer, are simultaneously formed. In some embodiments, to simultaneously form the first and second semiconductor plugs, the first and second semiconductor plugs are epitaxially grown from the substrate in the first and second channel holes, respectively. In some embodiments, the second semiconductor plug is spaced apart from the SSG sacrificial layer by the isolation structure.

Figure 5H:
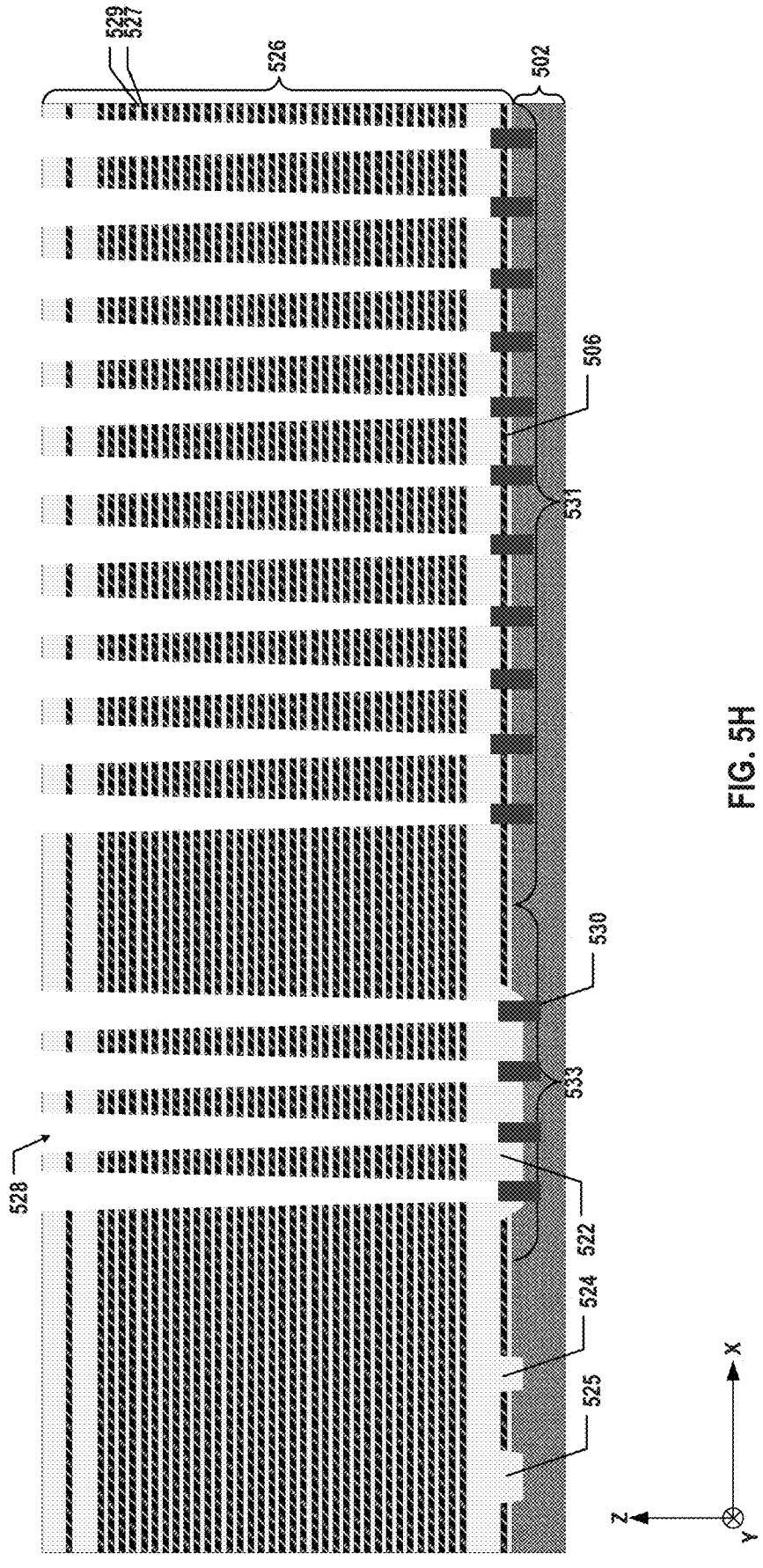
Figure 51:
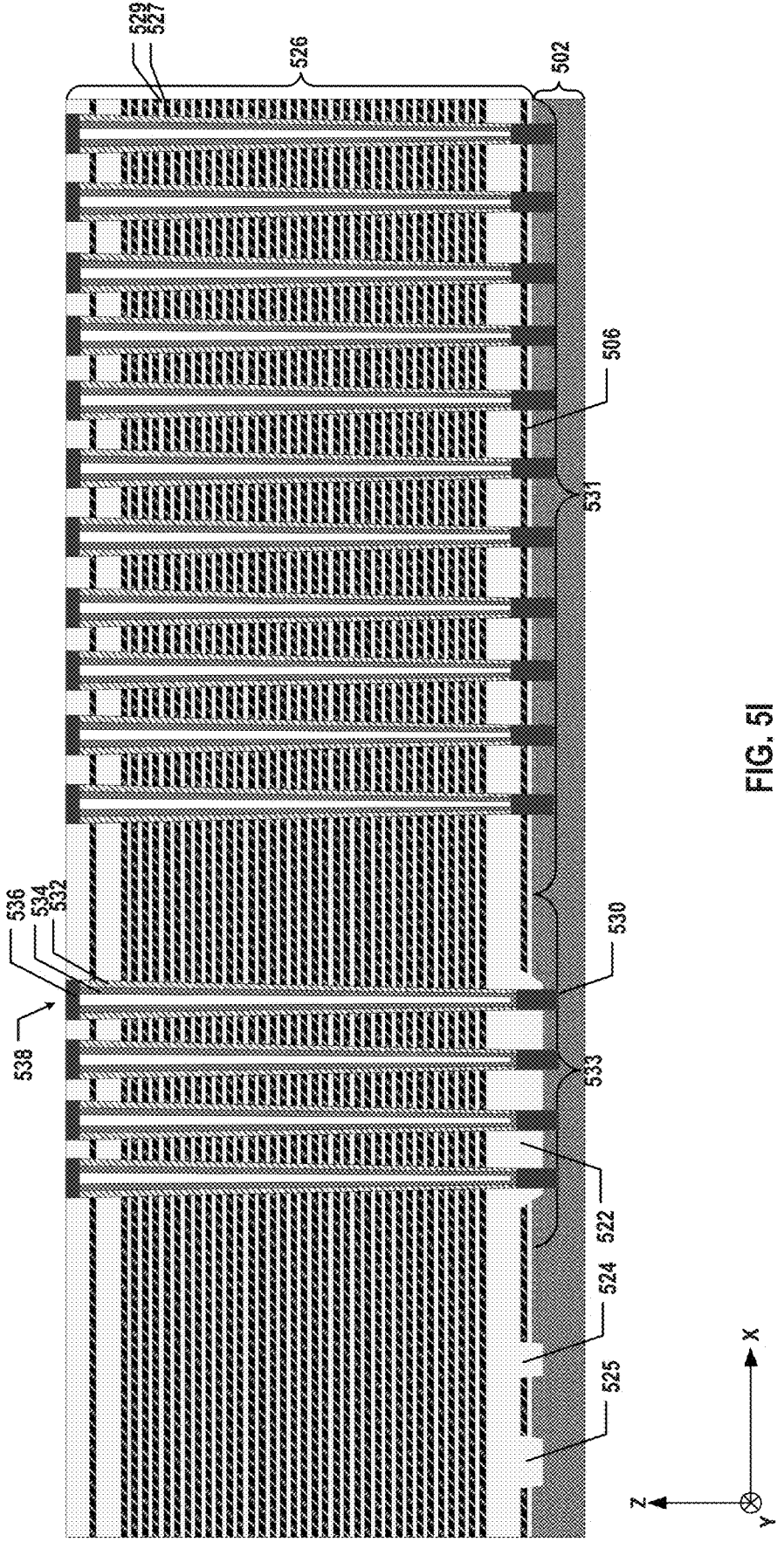

As illustrated in FIG. 5H, an array of channel holes 528 are formed, each of which extends vertically through interleaved word line dielectric layers 529 and word line sacrificial layers 527 of dielectric stack 526. Channel holes 528 in core array region 531 can extend further through SSG sacrificial layer 506 into silicon substrate 502. Channel hole 528 in edge region 533 aligned with isolation structure 522 can extend further through isolation structure 522, instead of SSG sacrificial layer 506, into silicon substrate 502. In some embodiments, channel hole 528 extending through isolation structure 522 extends into silicon substrate 502 further than channel hole 528 extending through SSG sacrificial layer 506. That is, the lower end of channel hole 528 extending through isolation structure 522 can be lower than that of channel hole 528 extending through SSG sacrificial layer 506. Channel holes 528 can be patterned using lithography and etched through the interleaved layers of silicon oxide and silicon nitride using dry etching and/or wet etching processes, such as deep RIE (DRIE). In some embodiments, channel hole 528 extends further through the top portion of silicon substrate 502. It is understood that the etching process through dielectric stack 526 may continue to etch part of silicon substrate 502. In some embodiments, a separate etching process is used to etch part of silicon substrate 502 after etching through dielectric stack 526. In some embodiments, the lateral dimension (e.g., the diameter) of channel hole 528 in edge region 533 is greater than that of channel hole 528 in core array region 531 to make the clean of etching residuals in channel hole 528 in edge region 533 easier as more etching residuals may be formed in channel hole 528 in edge region 533 than in core array region 531 due to the etch loading effect.

As illustrated in FIG. 5H, a semiconductor plug 530 is formed in the bottom portion of each channel hole 528 by filling the lower portion of channel hole 528 with a semiconductor material (e.g., single crystalline silicon epitaxially grown from silicon substrate 502) in any suitable directions (e.g., from the bottom surface and/or side surface). The fabrication processes for epitaxially growing semiconductor plug 530 can include, but not limited to, vapor-phase epitaxy (VPE), liquid-phase epitaxy (LPE), molecular-beam epitaxy (MBE), or any combinations thereof, following a cleaning process of removing the etching residuals in channel hole 528. Compared with the example in FIG. 1, by forming isolation structure 522 through SSG sacrificial layer 506 in edge region 533, even if semiconductor plug 530 failed to grow or had voids in channel hole 528 in edge region 533, SSG sacrificial layer 506 would be spaced apart from channel hole 528 to avoid SSG leakage in the later process, thereby increasing the production yield.

As illustrated in FIG. 5I, channel structures 538 are formed in channel holes 528 (shown in FIG. 5H). A memory film 532 (including a blocking layer, a storage layer, and a tunneling layer) and a semiconductor channel 534 are sequentially formed in this order along sidewalls of each channel hole 528 and on respective semiconductor plug 530. In some embodiments, memory film 532 is first deposited along the sidewalls of channel hole 528 and on semiconductor plug 530, and semiconductor channel 534 is then deposited over memory film 532. The blocking layer, storage layer, and tunneling layer can be sequentially deposited in this order using one or more thin film deposition processes, such as ALD, CVD, PVD, any other suitable processes, or any combination thereof, to form memory film 532. Semiconductor channel 534 can then be formed by depositing a semiconductor material, such as polysilicon, over the tunneling layer of memory film 532 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are sequentially deposited to form memory film 532 and semiconductor channel 534.

As illustrated in FIG. 5I, a capping layer is formed in channel hole 528 (shown in FIG. 5H) and over semiconductor channel 534 to completely or partially fill channel hole 528 (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug 536 can then be formed in the top portion of channel hole 528. A recess then can be formed in the top portion of channel hole 528 by wet etching and/or drying etching parts of memory film 532, semiconductor channel 534, and the capping layer in the top portion of channel hole 528. Channel plug 536 can then be formed by depositing semiconductor materials, such as polysilicon, into the recess by one or more thin film deposition processes, such as CVD, PVD, ALD, or any combination thereof. Channel structures 538 each including semiconductor plug 530, memory film 532, semiconductor channel 534, and channel plug 536 are thereby formed, according to some embodiments. In some embodiments, channel structure 538 in core array region 531 extends vertically through dielectric stack 526 with SSG sacrificial layer 506 into silicon substrate 502, whereas channel structure 538 in edge region 533 extends vertically through isolation structure 522 and dielectric stack 526 without SSG sacrificial layer 506 into silicon substrate 502.

In some embodiments, a staircase structure (not shown) can be formed, for example, on the edge of dielectric stack 526. The staircase structure can be formed by performing a plurality of so-called "trim-etch" cycles to the dielectric layer pairs of dielectric stack 526 toward silicon substrate 502. Due to the repeated trim-etch cycles applied to the dielectric layer pairs of dielectric stack 526, dielectric stack 526 can have one or more tilted edges and a top dielectric layer pair shorter than the bottom one. In some embodiments, alignment mark 525 is used for alignment during the formation of the staircase structure. Due to the flat surface of alignment mark 525, dents and residuals trapped therein can be avoided on the top surface of dielectric stack 526 to avoid the blockage of alignment mark 525.

In some embodiments, the dielectric stack is replaced with a memory stack by replacing the sacrificial layers with a plurality of conductive layers, respectively, such that the at least one channel structure is spaced apart from a bottommost one of the conductive layers by the isolation structure, as described below in detail.

Method 600 proceeds to operation 610, as illustrated in FIG. 6, in which the word line sacrificial layers and the SSG sacrificial layer are replaced with a plurality of conductive layers to form a plurality of word lines and an SSG, respectively, such that the first channel structure is in contact with the SSG, and the second channel structure is spaced apart from the SSG by the isolation structure.

Figure 5J:
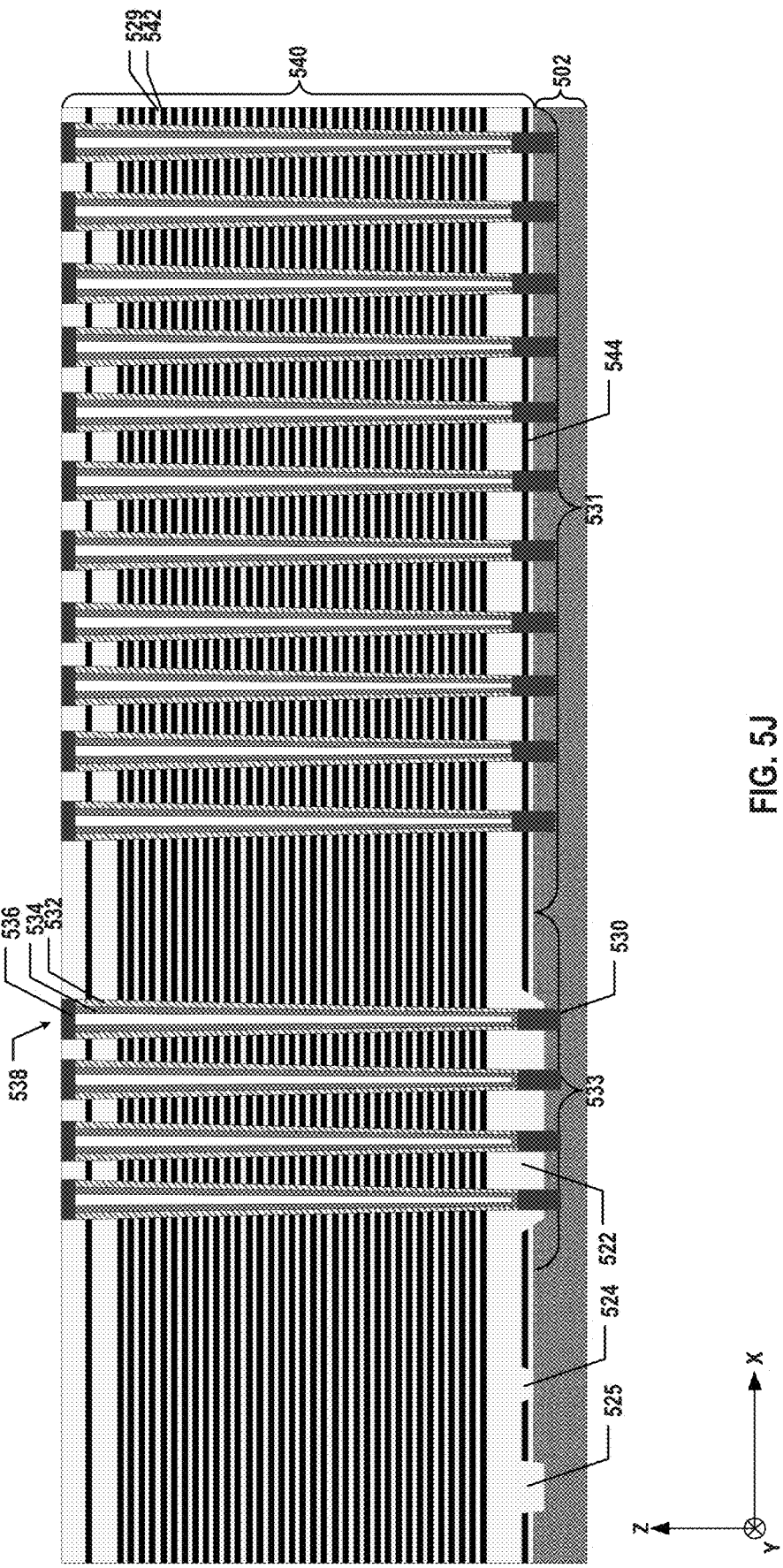

As illustrated in FIG. 5J, dielectric stack 526 (shown in FIG. 5I) is replaced with a memory stack 540 including interleaved word lines 542 and word line dielectric layers 529 and an SSG 544 by replacing word line sacrificial layers 527 (shown in FIG. 5H) with word lines 542 and replacing SSG sacrificial layer 506 (shown in FIG. 5I) with SSG 544. In some embodiments, an opening (slit) can be etched through dielectric stack 526 using wet etching and/or dry etching of dielectrics (e.g., silicon oxide and silicon nitride), such as DRIE. The opening can be used as the pathway for the so-called gate replacement process that replaces the sacrificial layers (e.g., word line sacrificial layers 527 and SSG sacrificial layer 506) with conductive layers (e.g., word lines 542 and SSG 544). The replacement of the sacrificial layers with the conductive layers can be performed by wet etching the sacrificial layers (e.g., silicon nitride) selective to dielectric layers 529 (e.g., silicon oxide) and filling the etching-resulted recesses with the conductive layers (e.g., W). The conductive layers can be deposited by PVD, CVD, ALD, electrochemical depositions, or any combination thereof.

As a result of replacing SSG sacrificial layer 506 with SSG 544 (i.e., the bottom-most conductive layer of memory stack 540), channel structure 538 in core array region 531 thereby extends through and in contact with SSG 544, according to some embodiments. In contrast, channel structure 538 in edge region 533 is still spaced apart from SSG 544 by isolation structure 522. During the gate replacement process, because channel structure 538 in edge region 533 is spaced apart from SSG sacrificial layer 506 by isolation structure 522, even if semiconductor plug 530 failed to grow or had voids in channel hole 528, the conductive material forming SSG 544 would not leak from the recess after removing SSG sacrificial layer 506 to silicon substrate 502 to cause short-circuit.

According to one aspect of the present disclosure, a 3D memory device includes a substrate, a memory stack on the substrate, a plurality of channel structures each extending vertically through the memory stack, an isolation structure, and an alignment mark. The memory stack includes a plurality of interleaved conductive layers and dielectric layers. An outmost one of the conductive layers toward the substrate is a source select gate line (SSG). The isolation structure extends vertically into the substrate and surrounds at least one of the channel structures in a plan view to separate the SSG and the at least one channel structure. The alignment mark extends vertically into the substrate and is coplanar with the isolation structure.

In some embodiments, the plurality of channel structures are disposed in a core array region and an edge region in a plan view, and the at least one channel structure is disposed in the edge region.

In some embodiments, the memory stack includes a staircase structure, the edge region is laterally between the staircase structure and the core array region, and the at least one channel structure is disposed in an outmost column adjacent to the staircase structure in the plan view.

In some embodiments, a lateral dimension of the at least one channel structure is greater than a lateral dimension of the channel structures disposed in the core array region.

In some embodiments, a lateral distance between the SSG and the at least one channel structure is between about 40 nm and about 80 nm.

In some embodiments, each of the channel structures includes a semiconductor plug at one end toward the substrate.

In some embodiments, the isolation structure is laterally between the SSG and the semiconductor plug of the at least one channel structure.

In some embodiments, the semiconductor plug of the at least one channel structure extends into the substrate further than a semiconductor plug of another one of the channel structures.

In some embodiments, the isolation structure and the alignment mark each include a dielectric.

In some embodiments, the alignment mark extends vertically through the SSG.

In some embodiments, the 3D memory device further includes an SSG cut extending vertically into the substrate and coplanar with the isolation structure and the alignment mark.

According to another aspect of the present disclosure, a 3D memory device includes a substrate, an SSG extending laterally, an isolation structure extending vertically through the SSG into the substrate, a first channel structure extending vertically through the SSG into the substrate, and a second channel structure extending vertically through the isolation structure into the substrate and spaced apart from the SSG by the isolation structure.

In some embodiments, the first channel structure is disposed in a core array region, and the second channel structure is disposed in an edge region in a plan view.

In some embodiments, the 3D memory device further includes a memory stack including a plurality of interleaved conductive layers and dielectric layers. The SSG is an outermost one of the conductive layers toward the substrate, according to some embodiments.

In some embodiments, the memory stack includes a staircase structure, the edge region is laterally between the staircase structure and the core array region, and the second channel structure in the edge region is disposed in an outmost column adjacent to the staircase structure in the plan view.

In some embodiments, each of the first and second channel structures includes a semiconductor plug at one end thereof, the semiconductor plug of the first channel structure is in contact with the SSG, and the semiconductor plug of the second channel structure is in contact with the isolation structure.

In some embodiments, the second channel structure extends into the substrate further than the first channel structures.

In some embodiments, the 3D memory device further includes an alignment mark extending vertically through the SSG into the substrate and coplanar with the isolation structure.

In some embodiments, the isolation structure and the alignment mark each include a dielectric.

In some embodiments, the 3D memory device further includes an SSG cut extending vertically through the SSG into the substrate and coplanar with the isolation structure and the alignment mark.

In some embodiments, a lateral dimension of the second channel structures is greater than a lateral dimension of the first channel structure.

In some embodiments, a lateral distance between the SSG and the second channel structure is between about 40 nm and about 80 nm.

According to still another aspect of the present disclosure, a method for forming a 3D memory device is disclosed. An SSG sacrificial layer is formed above a substrate. An isolation structure and an alignment mark each through the SSG sacrificial layer are simultaneously formed. A plurality of interleaved word line dielectric layers and word line sacrificial layers are formed above the SSG sacrificial layer, the isolation structure, and the alignment mark. A first channel structure extending vertically through the interleaved word line dielectric layers and word line sacrificial layers and the isolation structure is formed. The word line sacrificial layers and the SSG sacrificial layer are replaced with a plurality of conductive layers to form a plurality of word lines and an SSG, respectively, such that the first channel structure is spaced apart from the SSG by the isolation structure.

In some embodiments, a second channel structure extending vertically through the interleaved word line dielectric layers and word line sacrificial layers and the SSG sacrificial layer is formed in a same process for forming the first channel structure. In some embodiments, the second channel structure is in contact with the SSG by replacing the word line sacrificial layers and the SSG sacrificial layer with the plurality of conductive layers to form the plurality of word lines and the SSG.

In some embodiments, a buffer layer and a stop layer are sequentially formed on the SSG sacrificial layer.

In some embodiments, to form the isolation structure, an isolation trench and an alignment mark each through the stop layer, the buffer layer, and the SSG sacrificial layer into the substrate are simultaneously formed, a dielectric layer is deposited to fill the isolation trench and the alignment trench, the dielectric layer is planarized stopping at the stop layer, and the stop layer is removed.

In some embodiments, after removing the stop layer, the dielectric layer and the buffer layer are planarized to form the isolation structure and the alignment mark.

In some embodiments, an SSG cut through the SSG sacrificial layer is formed in a same process of forming the isolation structure and the alignment mark.

In some embodiments, the SSG sacrificial layer includes silicon nitride, and the isolation structure and the alignment mark include silicon oxide.

In some embodiments, to form the first and second channel structures in the same process, a first channel hole extending vertically through the interleaved word line dielectric layers and word line sacrificial layers and the isolation structure into the substrate, and a second channel hole extending vertically through the interleaved word line dielectric layers and word line sacrificial layers and the SSG sacrificial layer into the substrate, are simultaneously formed, and a first semiconductor plug in a bottom portion of the first channel hole spaced apart from the SSG sacrificial layer, and a second semiconductor plug in a bottom portion of the second channel hole in contact with the SSG sacrificial layer, are simultaneously formed.

In some embodiments, to simultaneously form the first and second semiconductor plugs, the first and second semiconductor plugs are epitaxially grown from the substrate in the first and second channel holes, respectively.

In some embodiments, the first channel hole extends into the substrate further than the second channel hole.

In some embodiments, a lateral dimension of the first channel structure is greater than a lateral dimension of the second channel structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a semiconductor layer;
a memory stack over the semiconductor layer comprising a plurality of interleaved conductive layers and dielectric layers, wherein at least one of the conductive layers toward the semiconductor layer is a source select gate line (SSG), and the memory stack comprises a core array region, a staircase region, and an edge region being laterally between the core array region and the staircase region;
first channel structures each extending vertically through the memory stack in the edge region and vertically into the semiconductor layer;
an isolation structure extending vertically through the SSG and extending vertically into the semiconductor layer in the edge region;
an SSG cut extending vertically through the SSG and extending into the semiconductor layer to cut off the SSG; and
an alignment mark extending vertically into the semiconductor layer,
wherein at least one of the first channel structures extends through the isolation structure and is separated from the SSG through the isolation structure;
the first channel structures extend into the semiconductor layer further than the isolation structure;
each of the at least one of the first channel structures comprises a first semiconductor plug at one end toward the semiconductor layer;
a first upper surface of the first semiconductor plug is above a second upper surface of the SSG; and
top surfaces of the isolation structure, the alignment mark, and the SSG cut are coplanar.

2. The 3D memory device of claim 1, wherein the at least one of the first channel structures is disposed in an outmost column adjacent to the staircase region in a plan view.

3. The 3D memory device of claim 1, further comprising:
second channel structures each extending vertically through the memory stack in the core array region,
wherein a lateral dimension of the at least one of the first channel structures is greater than a lateral dimension of the second channel structures.

4. The 3D memory device of claim 3, wherein:
each of the second channel structures comprises a second semiconductor plug at one end toward the semiconductor layer;
the second semiconductor plug of the second channel structures in the core array region is in contact with the SSG; and
the first semiconductor plug of the first channel structures in the edge region is in contact with the isolation structure.

5. The 3D memory device of claim 4, wherein the isolation structure is laterally between the SSG and the first semiconductor plug of the at least one of the first channel structures.

6. The 3D memory device of claim 4, wherein the first semiconductor plug extends into the semiconductor layer further than the second semiconductor plug.

7. The 3D memory device of claim 1, wherein the SSG cut is coplanar with the isolation structure.

8. The 3D memory device of claim 1, wherein the SSG cut and the isolation structure are both in contact with one dielectric layer over the SSG in the memory stack directly.

9. The 3D memory device of claim 1, wherein the SSG cut extends laterally across the core array region, the edge region, and the staircase region.

10. A three-dimensional (3D) memory device, comprising:

a semiconductor layer comprising a core array region, a staircase region, and an edge region being laterally between the core array region and the staircase region;

a source select gate line (SSG) extending laterally over the semiconductor layer;

an isolation structure extending vertically through the SSG into the semiconductor layer in the edge region;

a first channel structure extending vertically through the SSG into the semiconductor layer in the core array region;

a second channel structure extending vertically through the isolation structure into the semiconductor layer in the edge region and spaced apart from the SSG by the isolation structure;

an SSG cut extending vertically through the SSG and extending into the semiconductor layer to cut off the SSG; and an alignment mark extending vertically into the semiconductor layer, wherein the second channel structure extends into the semiconductor layer further than the isolation structure;

each of the first and second channel structures comprises a semiconductor plug at one end;

a first upper surface of the semiconductor plug of the first channel structure is above a second upper surface of the SSG, and top surfaces of the isolation structure, the alignment mark, and the SSG cut are coplanar.

11. The 3D memory device of claim 10, wherein the second channel structure disposes in an outmost column adjacent to the staircase region in a plan view.

12. The 3D memory device of claim 10, wherein a lateral distance between the SSG and the second channel structure is between about 40 nm and about 80 nm.

13. The 3D memory device of claim 10, wherein the SSG cut is coplanar with the isolation structure.

14. The 3D memory device of claim 10, wherein the SSG cut extends laterally across the core array region, the edge region, and the staircase region.

15. The 3D memory device of claim 10, wherein the semiconductor plug of the first channel structure is in contact with the SSG; and the semiconductor plug of the second channel structure is in contact with the isolation structure.

16. The 3D memory device of claim 10, wherein the second channel structure extends into the semiconductor layer further than the first channel structure.

17. The 3D memory device of claim 10, wherein a lateral dimension of the second channel structure is greater than a lateral dimension of the first channel structure.

18. A three-dimensional (3D) memory device, comprising:

a semiconductor layer comprising a core array region, a staircase region, and an edge region being laterally between the core array region and the staircase region;

a source select gate line (SSG) extending laterally over the semiconductor layer;

an isolation structure extending vertically through the SSG into the semiconductor layer;

a first channel structure extending vertically through the isolation structure into the semiconductor layer and spaced apart from the SSG by the isolation structure;

a SSG cut extending vertically through the SSG and extending into the semiconductor layer to cut off the SSG; and an alignment mark extending vertically into the semiconductor layer, wherein the isolation structure disposes in the edge region and the SSG cut extends laterally across the core array region, the edge region, and the staircase region;

the first channel structure extends into the semiconductor layer further than the isolation structure;

the first channel structure comprises a semiconductor plug at one end;

a first upper surface of the semiconductor plug is above a second upper surface of the SSG, and top surfaces of the isolation structure, the alignment mark, and the SSG cut are coplanar.

19. The 3D memory device of claim 18, wherein the first channel structure is disposed in an outmost column adjacent to the staircase region in a plan view.

20. The 3D memory device of claim 18, further comprising:

a second channel structure extending vertically through the isolation structure into the semiconductor layer in the edge region and spaced apart from the SSG by the isolation structure, wherein a lateral dimension of the first channel structure is greater than a lateral dimension of the second channel structure.

\* \* \* \* \*